US 12,457,877 B2

(12) United States Patent
Lim et al.

(10) Patent No.: US 12,457,877 B2
(45) Date of Patent: Oct. 28, 2025

(54) DISPLAY PANEL INCLUDING JUNCTION AREA WITH ASYMMETRIC SHAPE

(71) Applicant: Samsung Display Co., Ltd., Yongin-si (KR)

(72) Inventors: Cheho Lim, Cheonan-si (KR); Yeogeon Yoon, Seoul (KR); Juyong Kim, Busan (KR); Sangyeon Hwang, Anyang-si (KR); Seungkil Yang, Cheonan-si (KR); Seon Uk Lee, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 465 days.

(21) Appl. No.: 17/894,904

(22) Filed: Aug. 24, 2022

(65) Prior Publication Data

US 2023/0146173 A1 May 11, 2023

(30) Foreign Application Priority Data

Nov. 11, 2021 (KR) .................. 10-2021-0154533

(51) Int. Cl.
*H10K 59/38* (2023.01)
(52) U.S. Cl.
CPC ................... *H10K 59/38* (2023.02)
(58) Field of Classification Search
None
See application file for complete search history.

(56) References Cited

U.S. PATENT DOCUMENTS

| 6,755,983 | B2 | 6/2004 | Yudasaka |
| 11,088,216 | B2 | 8/2021 | Bae et al. |
| 2019/0025634 | A1* | 1/2019 | Park .................. G02F 1/133377 |
| 2020/0212113 | A1* | 7/2020 | Song .................. H10K 59/8792 |

(Continued)

FOREIGN PATENT DOCUMENTS

| EP | 4030485 A1 | 7/2022 |
| JP | 2006-72176 A | 3/2006 |

(Continued)

OTHER PUBLICATIONS

European Search Report for EP Application No. 22206282.0 dated Mar. 21, 2023, 11 pages.

*Primary Examiner* — Nduka E Ojeh
(74) *Attorney, Agent, or Firm* — Womble Bond Dickinson (US) LLP

(57) ABSTRACT

A display panel includes: a light emitting device layer including a light emitting area to emit a first color light; a partition layer on the light emitting device layer, and having a first opening overlapping with the light emitting area, and a second opening adjacent to the first opening; and a light control pattern located in the first opening to convert the first color light to a second color light. The partition layer includes: a first partition defining the first opening; a second partition extending from the first partition, and defining the second opening; and a junction area corresponding to a location where the second partition is joined to the first partition adjacent thereto. The junction area includes a first-side area, and a second-side area having an asymmetric shape with respect to the first-side area based on an extending direction in which the second partition extends.

22 Claims, 16 Drawing Sheets

(56) References Cited

U.S. PATENT DOCUMENTS

| | | |
|---|---|---|
| 2021/0193742 A1 | 6/2021 | Kim et al. |
| 2021/0249477 A1* | 8/2021 | Hong ..................... H10K 59/12 |
| 2021/0305322 A1 | 9/2021 | Song |
| 2022/0231087 A1* | 7/2022 | Jeon ....................... H10K 59/12 |

FOREIGN PATENT DOCUMENTS

| | | |
|---|---|---|
| KR | 10-2020-0124372 A | 11/2020 |
| KR | 10-2021-0078613 A | 6/2021 |
| WO | WO 2010/146653 A1 | 12/2010 |

\* cited by examiner

DISPLAY PANEL INCLUDING JUNCTION AREA WITH ASYMMETRIC SHAPE

CROSS-REFERENCE TO RELATED APPLICATION

This application claims priority to and the benefit of Korean Patent Application No. 10-2021-0154533, filed on Nov. 11, 2021 in the Korean Intellectual Property Office, the entire disclosure of which is incorporated by reference herein.

BACKGROUND

1. Field

Aspects of embodiments of the present disclosure relate to a display panel, and more particularly, to a display panel including a light control pattern.

2. Description of the Related Art

A display panel includes a transmissive display panel to selectively transmit source light generated from a light source, and an emissive display panel to self-emit source light. The display panel may include various kinds of light control patterns depending on the pixels to generate a color image. The light control pattern may transmit only a partial wavelength range of the source light, or may convert a color of the source light. Some light control patterns may change a characteristic of light, instead of changing the color of the source light.

The above information disclosed in this Background section is for enhancement of understanding of the background of the present disclosure, and therefore, it may contain information that does not constitute prior art.

SUMMARY

One or more embodiments of the present disclosure are directed to a display panel having enhanced reliability by improving (e.g., by reducing or minimizing) a failure that may result from erroneous ink droplet impact.

For example, one or more embodiments of the present disclosure are directed to a display panel including a first partition, and a second partition connected to the first partition to define a first opening and a second opening. An obtuse angle may be formed at one side of a junction area between the second partition and the first partition, and a right angle may be formed at an opposite side of the junction area between the second partition and the first partition, thereby reducing a probability of a failure caused by an erroneous ink droplet impact, and allowing the erroneous ink droplet to flow into the second opening through a right-angle part of the junction area.

According to one or more embodiments of the present disclosure, a display panel includes: a light emitting device layer including a plurality of light emitting areas to emit a first color light; a partition layer on the light emitting device layer, and having a plurality of first openings corresponding to the plurality of light emitting areas, respectively; and a plurality of light control patterns located within the plurality of first openings, respectively, at least one of the plurality of light control patterns being configured to convert the first color light into a second color light. The partition layer includes: a plurality of first partitions defining the plurality of first openings, respectively; a plurality of second partitions connected to adjacent ones of the first partitions that are adjacent thereto, the plurality of second partitions including a first type of second partition; and a junction area corresponding to a location where the first type of second partition is joined to a first partition from among the adjacent ones of the first partitions. The junction area includes a first-side area, and a second-side area having an asymmetric shape with respect to the first-side area based on an extending direction in which the first type of second partition extends.

In an embodiment, the plurality of second partitions may define a plurality of second openings that may not overlap with the plurality of light emitting areas, and may be interposed between the plurality of first openings.

In an embodiment, the first type of second partition may include: a first part spaced from the first partition; and a second part extending from the first part to contact the first partition, and the second part may have an asymmetric shape.

In an embodiment, the second part may include: a first connection part adjacent to the first part; and a second connection part adjacent to the first partition. A length of the first connection part in one direction may be different from a length of the second connection part in the one direction.

In an embodiment, the second part may include: a first surface at the first-side area; and a second surface at the second-side area. The first surface may contact the first partition at a right angle, and the second surface may contact the first partition at an obtuse angle.

In an embodiment, the plurality of light control patterns may include a first light control pattern, a second light control pattern, and a third light control pattern, and at least one of the first light control pattern, the second light control pattern, and the third light control pattern may include a quantum dot.

In an embodiment, the display panel may further include a color filter on the partition layer to transmit the second color light.

In an embodiment, the color filter may include a first color filter, a second color filter, and a third color filter having mutually different colors from each other, and each of the plurality of first openings may overlap with a corresponding one of the first color filter, the second color filter, and the third color filter.

In an embodiment, each of the plurality of second openings may overlap with the first color filter, the second color filter, and the third color filter.

According to one or more embodiments of the present disclosure, a display panel includes: a light emitting device layer including a light emitting area to emit a first color light; a partition layer on the light emitting device layer, and having a first opening overlapping with the light emitting area, and a second opening adjacent to the first opening; and a light control pattern located in the first opening to convert the first color light to a second color light. The partition layer includes: a first partition defining the first opening; a second partition extending from the first partition, and defining the second opening; and a junction area corresponding to a location where the second partition is joined to the first partition adjacent thereto. The junction area includes a first-side area, and a second-side area having an asymmetric shape with respect to the first-side area based on an extending direction in which the second partition extends.

In an embodiment, the second opening may not overlap with the light emitting area.

In an embodiment, a width of the first partition may be greater than or equal to a width of the second partition.

In an embodiment, at the first-side area of the junction area, a first surface of the second partition may form a right angle with respect to a contact surface of the first partition, and at the second-side area of the junction area, a second surface of the second partition may form an obtuse angle with respect to the contact surface of the first partition.

In an embodiment, the junction area may include: a first contact part at the first-side area, the first contact part being a part where a first surface of the second partition contacts a contact surface of the first partition; and a second contact part where a second surface of the second partition opposite to the first surface contacts the contact surface of the first partition, and the first contact part and the second contact part may have mutually different shapes from each other.

In an embodiment, the first contact part may have a concave shape, and the second contact part may have a convex shape.

In an embodiment, the second partition may include a first part, and a second part extending from the first part to contact the first partition. The second opening may include a first sub-opening, and a second sub-opening adjacent to the first sub-opening, and the first part may define the first sub-opening, and the second part may define the second sub-opening.

In an embodiment, the first sub-opening may be spaced from the first opening, with the second sub-opening interposed between the first sub-opening and the first opening.

According to one or more embodiments of the present disclosure, a display panel includes: a light emitting device layer including a light emitting area to emit a first color light; a partition layer on the light emitting device layer, and including a first opening overlapping with the light emitting area, and a second opening adjacent to the first opening; and a light control pattern located in the first opening to convert the first color light to a second color light. The partition layer includes: a first partition defining the first opening; a second partition extending from the first partition, and defining the second opening; and a junction area corresponding to a location where the second partition is joined to the first partition adjacent to the second partition. The junction area includes: a first contact part where a first surface of the second partition contacts a contact surface of the first partition; and a second contact part where a second surface of the second partition opposite to the first surface contacts the contact surface of the first partition, and one of the first contact part and the second contact part has a chamfer shape.

In an embodiment, the first contact part and the second contact part may have mutually different shapes from each other.

In an embodiment, another of the first contact part and the second contact part may include a right-angle part.

In an embodiment, another of the first contact part and the second contact part may include a groove.

In an embodiment, another of the first contact part and the second contact part may include an acute-angle part.

BRIEF DESCRIPTION OF THE FIGURES

The above and other aspects and features of the present disclosure will be more clearly understood from the following detailed description of the illustrative, non-limiting embodiments with reference to the accompanying drawings, in which.

DETAILED DESCRIPTION

Figure 1A:
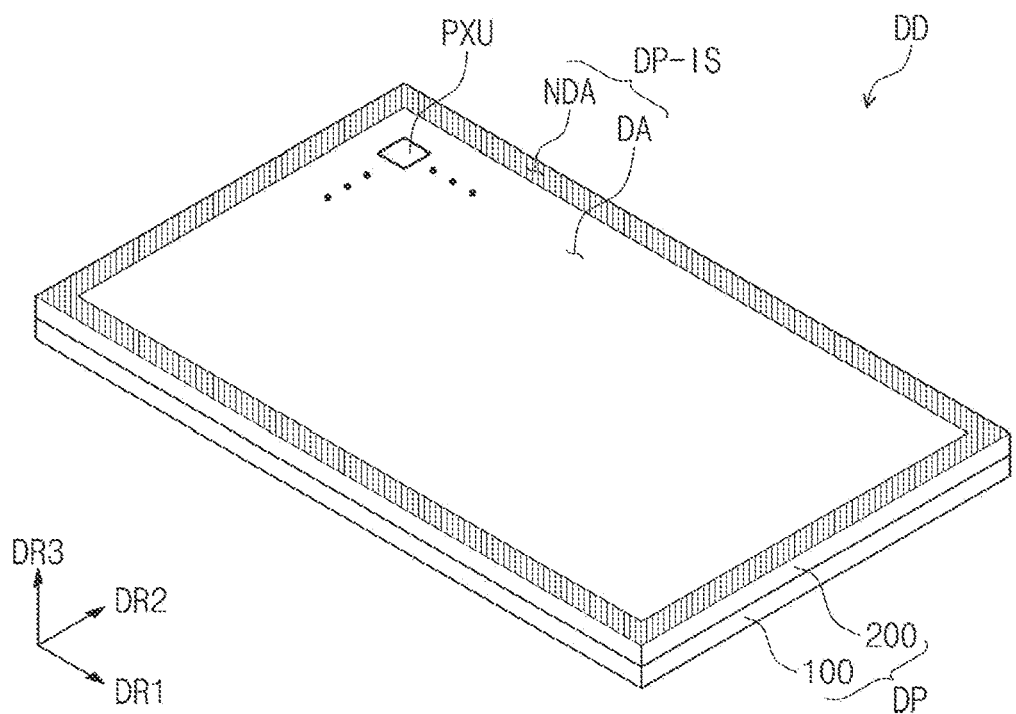
FIG. 1A is a perspective view of a display panel, according to an embodiment of the present disclosure.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes, thicknesses, proportions, and dimensions of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the figures, the x-axis, the y-axis, and the z-axis are not limited to three axes of the rectangular coordinate system, and may be interpreted in a broader sense. For example, the x-axis, the y-axis, and the z-axis may be perpendicular to or substantially perpendicular to one another, or may represent different directions from each other that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c," "at least one of a, b, and c," and "at least one selected from the group consisting of a, b, and c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 1B:
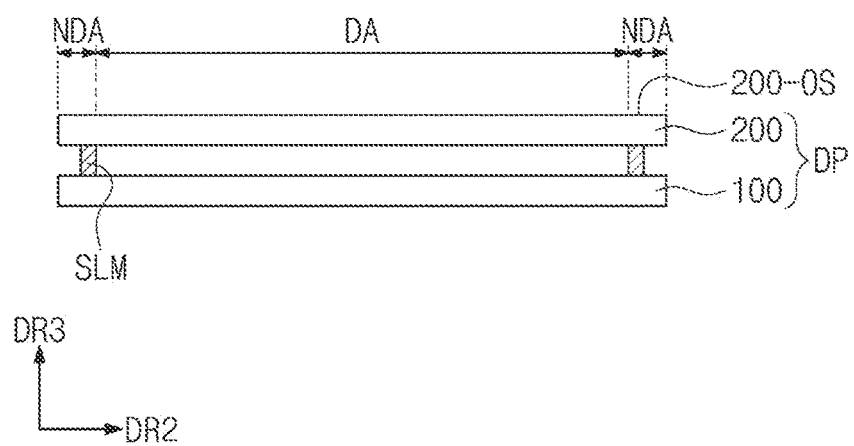
FIG. 1B is a cross-sectional view of a display panel, according to an embodiment of the present disclosure.

FIG. 1A is a perspective view of a display panel DP, according to an embodiment of the present disclosure. FIG. 1B is a cross-sectional view of the display panel DP, according to an embodiment of the present disclosure.

Referring to FIGS. 1A and 1B, the display panel DP of a display device DD may include any one of a liquid crystal display panel, an electrophoretic display panel, a microelectromechanical system (MEMS) display panel, an electrowetting display panel, a quantum dot light emitting display panel, and an organic light emitting display panel, but the present disclosure is not specifically limited thereto.

Unless otherwise specified or illustrated, the display panel DP may further include a chassis member or a molding member, and may further include various backlight units (e.g., various backlights or backlight panels), depending on a kind of the display panel DP.

The display panel DP may include a first display substrate 100 (e.g., a lower display substrate), and a second display substrate 200 (e.g., an upper display substrate) spaced apart from the first display substrate 100 while facing the first display substrate 100. A cell gap (e.g., a predetermined or specific cell gap) may be formed between the first display substrate 100 and the second display substrate 200. The cell gap may be maintained or substantially maintained by a sealant SLM, which connects (e.g., which couples or attaches) the first display substrate 100 to the second display substrate 200. The cell gap may be filled with an insulating material.

A grayscale display layer may be interposed between a base substrate of the first display substrate 100 and a base substrate of the second display substrate 200, to generate an image. The grayscale display layer may include a liquid crystal layer, an organic light emitting layer, an inorganic light emitting layer (e.g., a quantum dot light emitting layer, or an LED light emitting layer), or an electrophoretic layer, depending on the kind of display panel.

As illustrated in FIG. 1A, the display panel DP may display an image through a display surface DP-IS. An outer surface 200-OS of the second display substrate 200 illustrated in FIG. 1B may be defined as the display surface DP-IS of FIG. 1A.

The display surface DP-IS is parallel to or substantially parallel to a plane defined by a first directional axis DR1 and a second directional axis DR2. The display panel DP may include a display area DA and a non-display area NDA. Unit pixels PXU are disposed at (e.g., in or on) the display area DA, and are not disposed at (e.g., in or on) the non-display area NDA. The non-display area NDA is defined along an edge of the display surface DP-IS. The non-display area NDA may surround (e.g., around a periphery of) the display area DA. According to an embodiment of the present disclosure, the non-display area NDA may be omitted, or may be disposed at only one side of the display area DA.

The unit pixels PXU illustrated in FIG. 1A may define at least one pixel row and at least one pixel column. The unit pixel PXU, which is a minimum repeating unit, may include at least one pixel. The unit pixel PXU may include a plurality of pixels, which provide light having different colors from each other.

A normal direction to the display surface DP-IS is indicated as a third directional axis DR3, which is a thickness direction of the display panel DP. Hereinafter, front surfaces (e.g., top surfaces) and rear surfaces (e.g., bottom surfaces) of layers or units described below are divided according to the third directional axis DR3. However, the first to third directional axes DR1, DR2, and DR3 illustrated in the figures are provided for illustrative purposes. Hereinafter, first to third directions refer to the first to third directional axes DR1, DR2, and DR3, respectively, and are assigned the same reference symbols as those of the first to third directional axes DR1, DR2, and DR3.

According to an embodiment of the present disclosure, the display panel DP including a flat or substantially flat display surface DP-IS is illustrated, but the present disclosure is not limited thereto. The display panel DP may include a curved-type display surface, or a three-dimensional display surface. The three-dimensional display surface may include a plurality of display areas oriented in mutually different directions from one another.

Figure 1C:
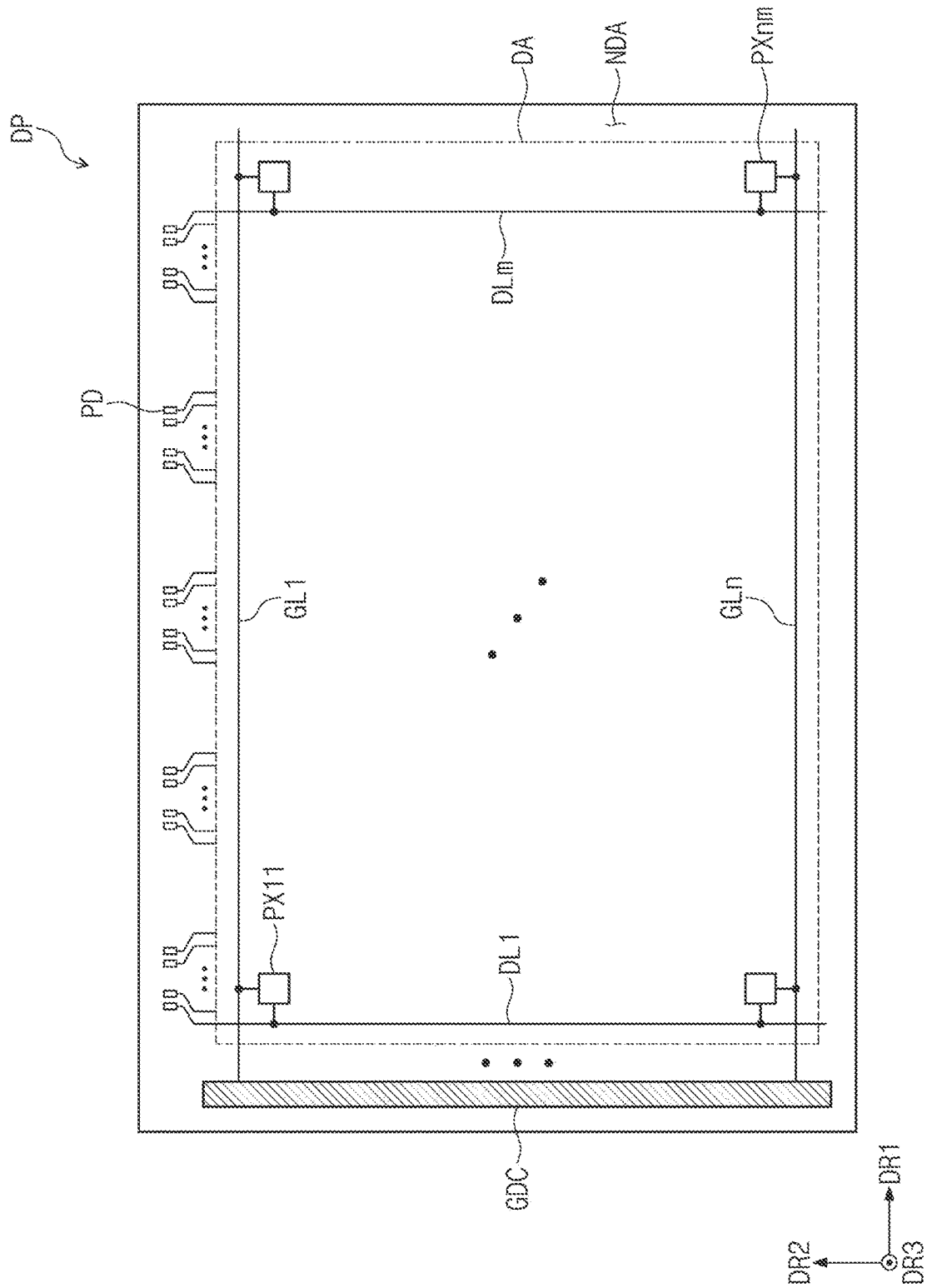
FIG. 1C is a plan view of a display panel, according to an embodiment of the present disclosure.
Figure 2:
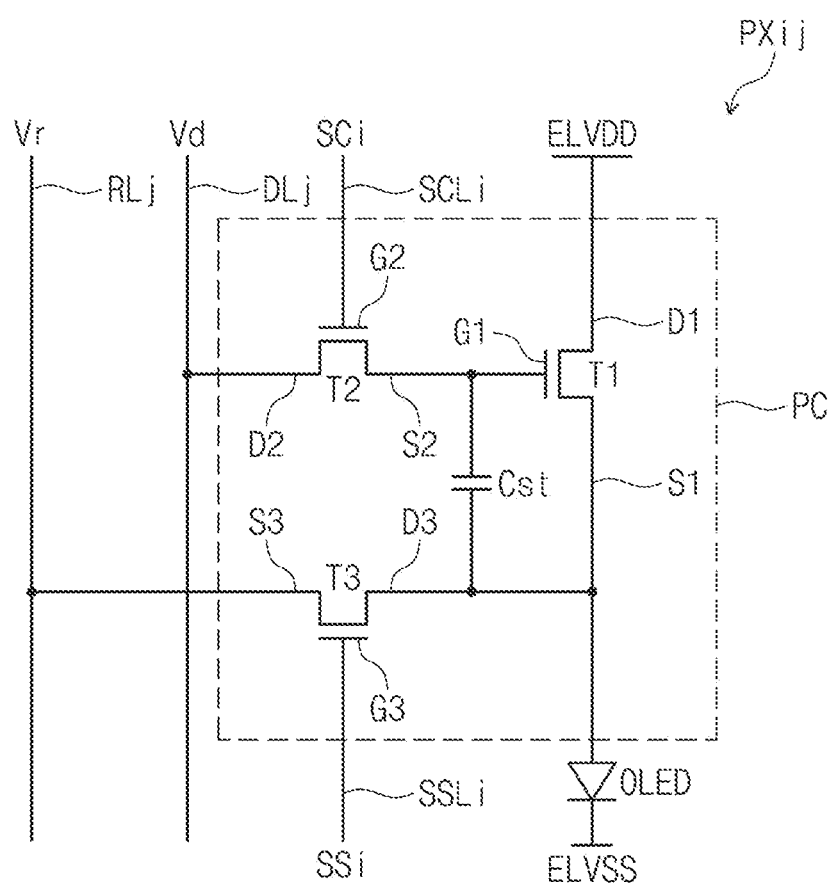
FIG. 2 is an equivalent circuit diagram of a pixel, according to an embodiment of the present disclosure.

FIG. 1C is a plan view of the display panel DP, according to an embodiment of the present disclosure. FIG. 2 is an equivalent circuit diagram of a pixel PXij, according to an embodiment of the present disclosure.

FIG. 1C illustrates a relationship among signal lines GL1 to GLn and DL1 to DLm, and pixels PX11 to PXnm included in the display panel DP, where n and m are natural numbers. The signal lines GL1 to GLn and DL1 to DLm may include a plurality of scan lines GL1 to GLn, and a plurality of data lines DL1 to DLm.

Each of the pixels PX11 to PXnm is connected to a corresponding scan line (e.g., a relevant scan line) from among the plurality of scan lines GL1 to GLn, and a corresponding data line (e.g., a relevant data line) from among the plurality of data lines DL1 to DLm. Each of the pixels PX11 to PXnm may include a pixel driving circuit and a light emitting device. More various kinds of signal lines may be provided at (e.g., in or on) the display panel DP depending on a configuration of the pixel driving circuit of the pixels PX11 to PXnm.

The display area DA and the non-display area NDA of the display device DD illustrated in FIG. 1A may be defined in the display panel DP shown in FIG. 1C. The pixels PX11 to PXnm are disposed at (e.g., in or on) the display area DA, and a gate driving circuit GDC is disposed at (e.g., in or on) the non-display area NDA. A plurality of pixels from among the pixels PX11 to PXnm form one group, and are repeatedly disposed. The group corresponds to the unit pixel PXU described above with reference to FIG. 1A.

FIG. 2 illustrates the pixel PXij connected to an i-th scan line SCLi, an i-th sensing line SSLi, a j-th data line DLj, and a j-th reference line RLj, where i and j are natural numbers. The pixel PXij includes a pixel circuit PC, and a light emitting device OLED connected to the pixel circuit PC. The pixel circuit PC may include a plurality of transistors T1 to T3, and a capacitor Cst. The plurality of transistors T1 to T3 may be formed through a low temperature polycrystalline silicon (LTPS) process, or a low temperature polycrystalline oxide (LTPO) process. Although the plurality of transistors T1 to T3 will be described in more detail in the context of an N type transistor for convenience purposes, at least one transistor from among the plurality of transistors T1 to T3 may be implemented as a P type transistor in some embodiments.

According to the present embodiment, the pixel circuit PC is illustrated as including a first transistor T1 (e.g., a driving transistor), a second transistor T2 (e.g., a switch transistor), a third transistor T3 (e.g., a sensing transistor), and a capacitor Cst, but the pixel circuit PC is not limited thereto. In other embodiments, the pixel circuit PC may further include one or more additional transistors, and/or may further include one or more additional capacitors.

The light emitting device OLED may be an organic light emitting device or an inorganic light emitting device, and may include an anode (e.g., a first electrode) and a cathode (e.g., a second electrode). The anode of the light emitting device OLED may receive a first voltage ELVDD through the first transistor T1, and the cathode of the light emitting device OLED may receive a second voltage ELVSS. The light emitting device OLED may emit light by receiving the first voltage ELVDD and the second voltage ELVSS.

The first transistor T1 may include a drain D1 to receive the first voltage ELVDD, a source S1 connected to the anode of the light emitting device OLED, and a gate G1 connected to the capacitor Cst. The first transistor T1 may control a driving current, which flows from the first voltage ELVDD to the light emitting device OLED, in response to a voltage value stored in the capacitor Cst.

The second transistor T2 may include a drain D2 connected to the j-th data line DLj, a source S2 connected to the capacitor Cst, and a gate G2 to receive an i-th first scan signal SCi. The j-th data line DLj may receive a data voltage Vd. The second transistor T2 provides the data voltage Vd to the first transistor T1, in response to the i-th first scan signal SCi.

The third transistor T3 may include a source S3 connected to the j-th reference line RLj, a drain D3 connected to the anode of the light emitting device OLED, and a gate G3 to receive an i-th second scan signal SSi. The j-th reference line RLj may receive a reference voltage Vr. The third transistor T3 may initialize the capacitor Cst and the anode of the light emitting device OLED.

The capacitor Cst stores a voltage corresponding to a difference between the voltage received from the second transistor T2 and the first voltage ELVDD. The capacitor Cst may be connected to the gate G1 of the first transistor T1 and the anode of the light emitting device OLED.

Figure 3A:
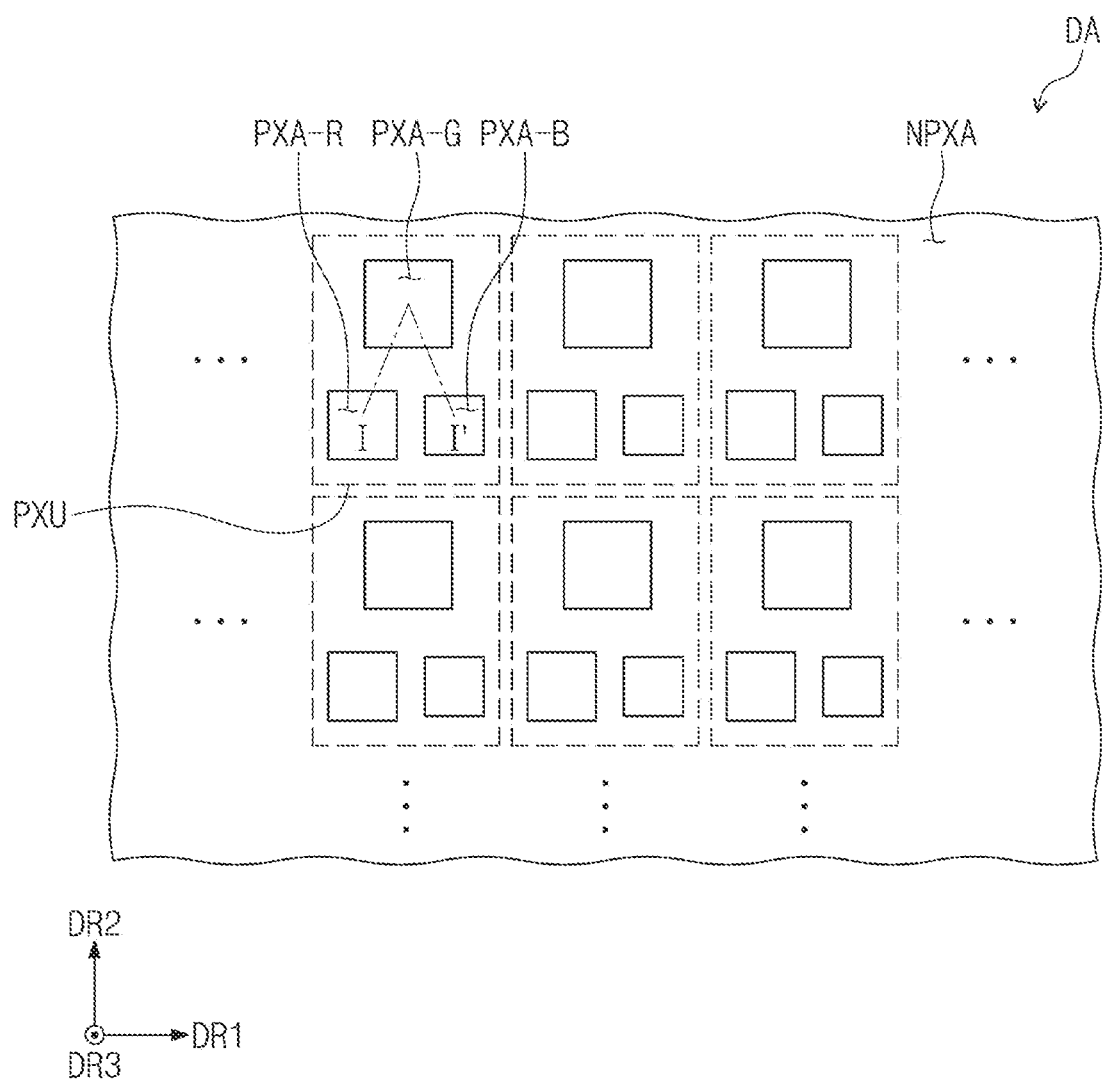
FIG. 3A is an enlarged plan view of a display area, according to an embodiment of the present disclosure.
Figure 3B:
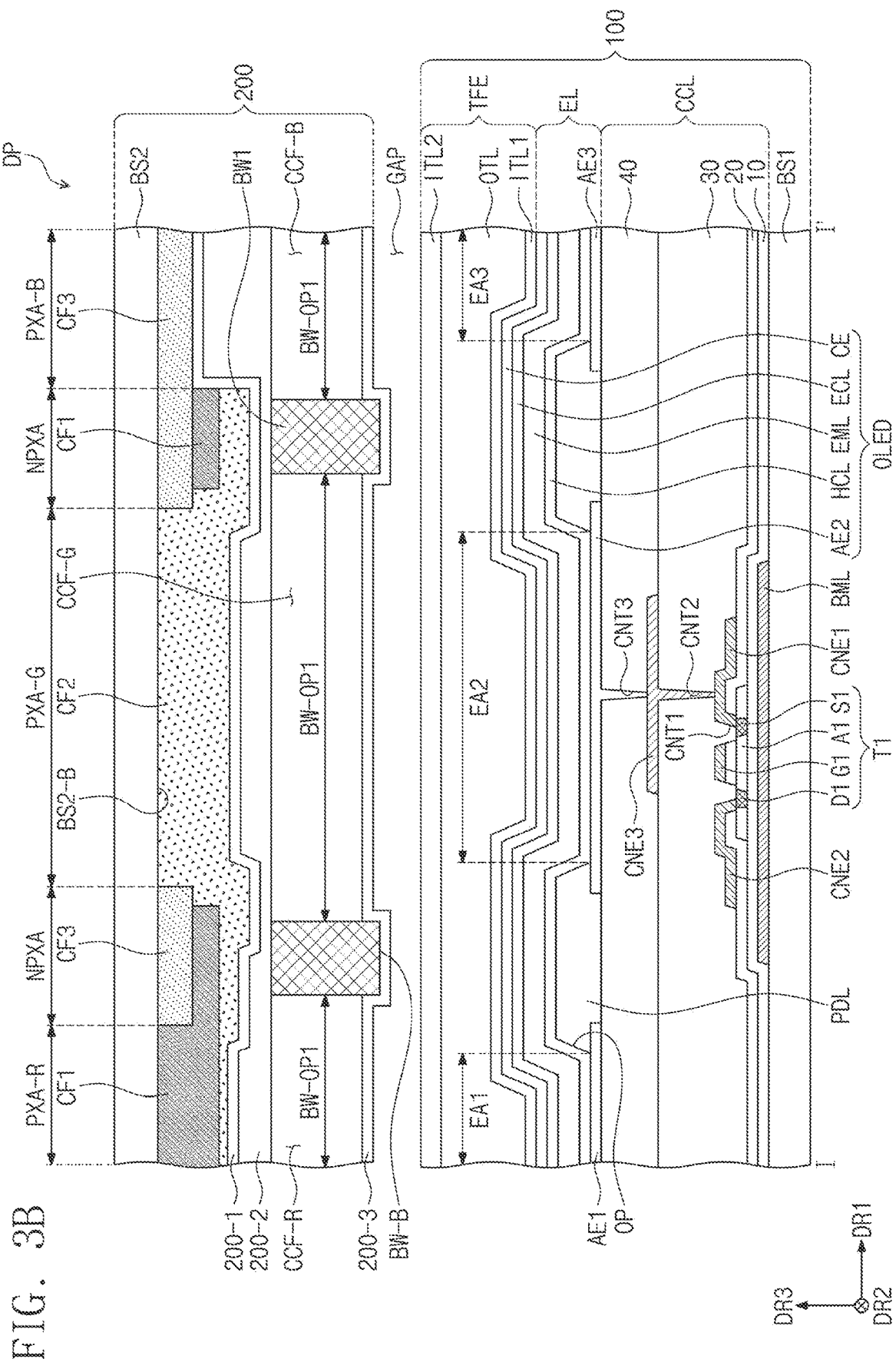
FIG. 3B is a cross-sectional view of a display area, according to an embodiment of the present disclosure.

FIG. 3A is an enlarged plan view of a display area, according to an embodiment of the present disclosure. FIG. 3B is a cross-sectional view of a display area, according to an embodiment of the present disclosure.

As illustrated in FIG. 3A, the unit pixels PXU are arranged along the first direction DR1 and the second direction DR2. According to the present embodiment, the unit pixels PXU may include a first pixel, a second pixel, and a third pixel to emit light having mutually different colors from each other. For example, the first pixel, the second pixel, and the third pixel may generate red light, green light, and blue light, respectively. FIG. 3A illustrates a first pixel area PXA-R, a second pixel area PXA-G, and a third pixel area PXA-B representing the first pixel, the second pixel, and the third pixel, respectively. A peripheral area NPXA is disposed among the first pixel area PXA-R, the second pixel area PXA-G, and the third pixel area PXA-B. The peripheral area NPXA may define (e.g., may set) a boundary among the first pixel area PXA-R, the second pixel area PXA-G, and the third pixel area PXA-B, to prevent or substantially prevent color from being mixed among the first pixel area PXA-R, the second pixel area PXA-G, and the third pixel area PXA-B.

Referring to FIG. 3A, the first pixel area PXA-R and the third pixel area PXA-B are disposed in the same row as each other, and the second pixel area PXA-G is disposed in a row different from the row of the first pixel area PXA-R and the third pixel area PXA-B. The second pixel area PXA-G may have the largest area, and the third pixel area PXA-B may have the smallest area, but the present disclosure is not limited thereto. Although the first pixel area PXA-R, the second pixel area PXA-G, and the third pixel area PXA-B are illustrated as having a square or substantially square shape according to the present embodiment, the present disclosure is not limited thereto.

FIG. 3B is a cross-sectional view taken along the line I-I' of FIG. 3A.

FIG. 3B focuses on the cross-section corresponding to the second pixel area PXA-G, in which a cross-section of the first transistor T1 is illustrated. A lamination structure of the first pixel area PXA-R and the third pixel area PXA-B may be the same or substantially the same as that of the second pixel area PXA-G.

The first display substrate 100 may include a first base layer BS1 (e.g., a base layer), a circuit layer CCL, a light emitting device layer EL, and a thin film encapsulation layer TFE. The circuit layer CCL may be disposed on the first base layer BS1. The circuit layer CCL may include a plurality of insulating layers, a plurality of conductive layers, and a semiconductor layer. The light emitting device layer EL may be disposed on the circuit layer CCL. The thin film encapsulation layer TFE is disposed on the light emitting device layer EL to cover (e.g., to encapsulate) the light emitting device layer EL.

The first base layer BS1 may be a lamination structure including a silicon substrate, a plastic substrate, a glass substrate, an insulating film, or a plurality of insulating layers.

A light blocking pattern BML may be disposed on the first base layer BS1. The light blocking pattern BML may include a metal. A signal line may be disposed at (e.g., in or on) the same layer as that of the light blocking pattern BML. A first insulating layer 10 is disposed on the first base layer BS1 to cover the light blocking pattern BML.

A semiconductor pattern is disposed on the first insulating layer 10 while overlapping with the light blocking pattern BML. The semiconductor pattern may have an electrical property that varies depending on a doping state of the semiconductor pattern. The semiconductor pattern may include a first area having a higher conductivity, and a second area having a lower conductivity. The first area may be doped with an N-type dopant or a P-type dopant. A P-type transistor may include a doping area doped with a P-type dopant, and an N-type transistor may include a doping area doped with an N-type dopant. The second area may be a non-doping area, or may be an area doped at a concentration lower than the concentration of the first area.

The semiconductor pattern may include a source area (e.g., a source or a source region) S1, a channel area A1 (e.g., an active area or an active region), and a drain area (e.g., a drain or a drain region) D1. A second insulating layer 20 is disposed on the first insulating layer 10. The second insulating layer 20 has contact holes CNT1 defined (e.g., penetrating therethrough) to expose the source area S1 and the drain area D1. The first insulating layer 10 and the second insulating layer 20 may be inorganic layers.

Connection electrodes CNE1 and CNE2 are disposed on the second insulating layer 20. A first connection electrode CNE1 may electrically connect the source area S1 of the first transistor T1 to the drain D3 of the third transistor T3 illustrated in FIG. 2. A second connection electrode CNE2 electrically connects the drain area D1 of the first transistor T1 to a signal line for receiving the first voltage ELVDD illustrated in FIG. 2.

A third insulating layer 30 is disposed on the second insulating layer 20. A third connection electrode CNE3 is disposed on the third insulating layer 30. The third connection electrode CNE3 may be connected to the first connection electrode CNE1 through a contact hole CNT2 formed through (e.g., penetrating) the third insulating layer 30. A fourth insulating layer 40 is disposed on the third insulating layer 30. Anodes AE1, AE2, and AE3 are disposed on the fourth insulating layer 40. The anode AE2 may be connected to the third connection electrode CNE3 through a contact hole CNT3 formed through (e.g., penetrating) the fourth insulating layer 40. The third insulating layer 30 and the fourth insulating layer 40 may be organic layers.

The light emitting device OLED and a pixel defining layer PDL are disposed on the fourth insulating layer 40. An opening OP of the pixel defining layer PDL exposes at least some of the anodes AE1, AE2, and AE3. The opening OP of the pixel defining layer PDL may define the light emitting areas EA1, EA2, and EA3. An area, in which the pixel defining layer PDL is disposed, may be defined as a non-light emitting area.

A hole control layer HCL may be disposed in common in the light emitting areas EA1, EA2, and EA3 and the non-light emitting area. A common layer, such as the hole control layer HCL, may be commonly disposed in a plurality of unit pixels PXU of the display area DA. The hole control layer HCL may include a hole transport layer and a hole injection layer.

A light emitting layer EML is disposed on the hole control layer HCL. The light emitting layer EML may be disposed in common in the light emitting areas EA1, EA2, and EA3 and the non-light emitting area. The light emitting layer EML may generate source light. The light emitting layer EML may include an organic light emitting material or an inorganic light emitting material. According to the present embodiment, the source light may be blue light, which will be described hereinafter as a first color light.

An electron control layer ECL is disposed on the light emitting layer EML. The electron control layer ECL may include an electron transport layer and an electron injection layer. A cathode CE is disposed on the electron control layer ECL. The thin film encapsulation layer TFE is disposed on the cathode CE. The thin film encapsulation layer TFE is commonly disposed in the plurality of pixels PX. According to the present embodiment, the thin film encapsulation layer TFE directly covers the cathode CE.

The thin film encapsulation layer TFE includes at least an inorganic layer or an organic layer. The thin film encapsulation layer TFE may include a first inorganic encapsulation layer ITL1, an organic encapsulation layer OTL, and a second inorganic encapsulation layer ITL2, which are sequentially laminated. The organic encapsulation layer OTL may be interposed between the first inorganic encapsulation layer ITL1 and the second inorganic encapsulation layer ITL2. The first inorganic encapsulation layer ITL1 and the second inorganic encapsulation layer ITL2 may be formed by depositing an inorganic material, and the organic encapsulation layer OTL may be formed by depositing, printing, or coating an organic material.

The first inorganic encapsulation layer ITL1 and the second inorganic encapsulation layer ITL2 protect the light emitting device layer EL from moisture and oxygen, and the organic encapsulation layer OTL protects the light emitting device layer EL from foreign materials, such as dust particles. The first inorganic encapsulation layer ITL1 and the second inorganic encapsulation layer ITL2 may include at least one of a silicon nitride, a silicon oxynitride, a silicon oxide, a titanium oxide, or an aluminum oxide. The organic encapsulation layer OTL may include a polymer, for example, such as an acrylic organic layer. However, this is provided for the illustrative purposes, and the present disclosure is not limited thereto.

Although FIG. 2 illustrates that the thin film encapsulation layer TFE includes two inorganic layers and one organic layer, the present disclosure is not limited thereto. For example, the thin film encapsulation layer TFE may include three inorganic layers and two organic layers. In this case, the thin film encapsulation layer TFE may have a structure in which the inorganic layer and the organic layer are alternately laminated. In some embodiments, the display panel DP may further include a refractive index control layer provided on the thin film encapsulation layer TFE to improve light output efficiency.

The second display substrate 200 may be disposed on the first display substrate 100. The second display substrate 200 may include a second base layer BS2 (e.g., a cover base layer), a first color filter CF1, a second color filter CF2, a third color filter CF3, a first light control pattern CCF-R, a second light control pattern CCF-G, a third light control pattern CCF-B, a first partition BW1, a second partition, and a plurality of insulating layers 200-1, 200-2, and 200-3.

The second base layer BS2 may be a lamination structure including a silicon substrate, a plastic substrate, a glass substrate, an insulating film, or a plurality of insulating layers. A bottom surface BS2-B of the second base layer BS2 may be flat or substantially flat.

The plurality of color filters CF1, CF2, and CF3 may be disposed on one surface of the second base layer BS2. For example, the plurality of color filters CF1, CF2, and CF3 may be disposed on the bottom surface BS2-B of the second base layer BS2. The first color filter CF1 may be disposed to overlap with the first light emitting area EA1, the second color filter CF2 may be disposed to overlap with the second light emitting area EA2, and the third color filter CF3 may be disposed to overlap with the third light emitting area EA3.

The third color filter CF3 may be disposed at (e.g., in or on) the third pixel area PXA-B and the peripheral area NPXA. A plurality of openings may be defined in the third color filter CF3. The plurality of openings may define the first pixel area PXA-R and the second pixel area PXA-G. The first color filter CF1 may be disposed to overlap with the first pixel area PXA-R, and the second color filter CF2 may be disposed to overlap with the second pixel area PXA-G.

Each of the first to third color filters CF1, CF2, and CF3 transmits light in a corresponding wavelength range (e.g., a predetermined or specific wavelength range), and blocks light in a wavelength outside of the corresponding wavelength range (e.g., the relevant wavelength range). Each of the first to third color filters CF1, CF2, and CF3 includes a base resin, and dyes and/or pigments dispersed in the base resin. The base resin is a medium in which the dyes and/or the pigments are dispersed, and may be formed of various suitable resin compositions that may be generally referred to as binders.

The first color filter CF1 may transmit a second color light, the second color filter CF2 may transmit a third color light, and the third color filter CF3 may transmit the first color light, which is the source light provided from the light emitting layer EML. For example, the first color filter CF1 may be a red color filter, the second color filter CF2 may be a green color filter, and the third color filter CF3 may be a blue color filter. According to an embodiment of the present disclosure, the first color filter CF1 and the second color filter CF2 may be yellow color filters. In this case, the first color filter CF1 and the second color filter CF2 may be connected to each other.

The first color filter CF1 may be disposed to be adjacent to the second color filter CF2. The third color filter CF3 may overlap with the first color filter CF1 and the second color filter CF2. An area where all of the plurality of color filters CF1, CF2, and CF3 overlap with each other may block light. In this case, a black matrix (not illustrated) including a light blocking material may not be included. The area where all of the plurality of color filters CF1, CF2, and CF3 overlap with each other may correspond to the peripheral area NPXA, and may correspond to the first partition BW1. Here, the term "corresponding to" refers to two components that overlap with each other in a plan view (e.g., when viewed in the thickness direction DR3 of the display panel DP), and is not limited to having the same area.

The first insulating layer 200-1 may be disposed under (e.g., underneath) the first color filter CF1, the second color filter CF2, and the third color filter CF3, and covers the first color filter CF1, the second color filter CF2, and the third color filter CF3. The second insulating layer 200-2 may cover the first insulating layer 200-1, and may have a flat or substantially flat bottom surface. The first insulating layer 200-1 may be an inorganic layer, and the second insulating layer 200-2 may be an organic layer.

The first partition BW1 may be disposed under (e.g., underneath) the second insulating layer 200-2. The first partition BW1 may be disposed at (e.g., in or on) the peripheral area NPXA. The first partition BW1 may define a first opening BW-OP1. In other words, the first opening BW-OP1 may be surrounded (e.g., around a periphery thereof) by the first partition BW1. The first partition BW1 may include a material having a suitable transmittance of a desired value (e.g., a predetermined or specific value) or less. For example, the first partition BW1 may include a light blocking material, for example, such as a black component. The first partition BW1 may include a black dye or a black pigment mixed with a base resin. For example, the first partition BW1 may include any one of propylene glycol methyl ether acetate, 3-methoxy-butyl acetate, an acrylate monomer, an acrylic monomer, an organic pigment, or an acrylate ester. A bottom surface BW-B of the first partition BW1 may be defined on a plane facing the thin film encapsulation layer TFE.

The plurality of first openings BW-OP1 may correspond to the first pixel area PXA-R, the second pixel area PXA-G, and the third pixel area PXA-B, respectively. The plurality of first openings BW-OP1 may correspond to the first light emitting area EA1, the second light emitting area EA2, and the third light emitting area EA3, respectively. Here, the term "corresponding to" refers to two components that overlap with each other in a plan view (e.g., when viewed in the thickness direction DR3 of the display panel DP), and is not limited to having the same area.

The first light control pattern CCF-R may be disposed within (e.g., inside) one opening of the plurality of first openings BW-OP1, and may convert the first color light into the second color light. The second light control pattern CCF-G may be disposed within (e.g., inside) one opening of the plurality of first openings BW-OP1, and may convert the first color light into the third color light. The third light control pattern CCF-B may be disposed within (e.g., inside) one opening of the plurality of first openings BW-OP1, and may transmit the first color light.

Each of the first light control pattern CCF-R, the second light control pattern CCF-G, and the third light control pattern CCF-B may be formed through an ink-jet process. The first light control pattern CCF-R, the second light control pattern CCF-G, and the third light control pattern CCF-B may be formed by providing a composition to a space, for example, such as in each of the plurality of first openings BW-OP1 defined by the first partition BW1.

At least some of the first light control pattern CCF-R, the second light control pattern CCF-G, and the third light control pattern CCF-B may include a quantum dot. In an embodiment, each of the first light control pattern CCF-R and the second light control pattern CCF-G may include a base resin, a quantum dot, and scattering particles, and the third light control pattern CCF-B may include a base resin and scattering particles. According to an embodiment of the present disclosure, the scattering particles may be omitted as needed or desired from any one of the first light control pattern CCF-R, the second light control pattern CCF-G, and the third light control pattern CCF-B.

The base resin is a medium in which quantum dots and/or scattering particles are dispersed, and may be formed of various suitable resin compositions that may generally be referred to as a binder. However, the present disclosure is not limited thereto. For example, the medium may be referred to as the base resin, regardless of the name of the medium, an additional different function, or a material constituting the medium, as long as the medium allows for the scattering of the quantum dots. The base resin may be a polymer resin. For example, the base resin may be an acrylic resin, a urethane resin, a silicone resin, or an epoxy resin. The base resin may be a transparent resin.

The scattering particles may be titanium oxide ($TiO_2$) or silica-based nanoparticles. The scattering particles may increase an amount of light provided to the outside by scattering incident light. According to an embodiment of the present disclosure, at least one of the first light control pattern CCF-R and the second light control pattern CCF-G may not include scattering particles.

The quantum dot may be a particle that converts a wavelength of incident light. The quantum dot has a material having a crystal structure having a size of several nanometers, and includes hundreds to thousands of atoms. The quantum dot exhibits a quantum confining effect of increasing an energy band gap due to the small size. When light of a wavelength having energy higher than that of the band gap is incident on the quantum dot, the quantum dot absorbs the light to be in an excited state. The quantum dot is dropped to be in a ground state while emitting light of a desired wavelength (e.g., a predetermined or specific wavelength). Light of the emitted wavelength has a value corresponding to the band gap. When the size and the composition of the quantum dot are adjusted, the light emission characteristics resulting from the quantum constraint effect may be adjusted.

The core of each quantum dot may include a material selected from a Group II-VI compound, a Group III-V compound, a Group IV-VI compound, a Group IV element, a Group IV compound, or suitable combinations thereof.

The Group II-VI compound may include a material selected from the group consisting of a binary compound selected from the group consisting of CdSe, CdTe, CdS, ZnS, ZnSe, ZnTe, ZnO, HgS, HgSe, HgTe, MgSe, MgS, and a suitable mixture thereof, a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a suitable mixture thereof, and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a suitable mixture thereof.

The group III-VI compound may include a binary compound, such as $In_2S_3$ or $In_2Se_3$, a ternary compound, such as $InGaS_3$ or $InGaSe_3$, or any suitable combinations thereof.

The group compound may be selected from a ternary compound selected from the group consisting of AgInS, $AgInS_2$, CuInS, $CuInS_2$, $AgGaS_2$, $CuGaS_2$, $CuGaO_2$, $AgGaO_2$, $AgAlO_2$, and a suitable mixture thereof, or a quaternary compound, such as $AgInGaS_2$ or $CuInGaS_2$.

The group III-V compound may be selected from the group consisting of a binary compound selected from the group consisting of GaN, GaP, GaAs, GaSb, AlN, AlP, AlAs, AlSb, InN, InP, InAs, InSb, and a suitable mixture thereof, a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and a suitable mixture thereof, and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, and a suitable mixture thereof. Meanwhile, the group III-V compound may further include a metal in group II. For example, InZnP may be selected as the group III-II-V compound.

The group IV-VI compound may be selected from the group consisting of a binary compound selected from the group consisting of SnS, SnSe, SnTe, PbS, PbSe, PbTe, and a suitable mixture thereof, a ternary compound selected from the group consisting of SnSeS, SnSeTe, SnSTe, PbSeS, PbSeTe, PbSTe, SnPbS, SnPbSe, SnPbTe, and a suitable mixture thereof, and a quaternary compound selected from the group consisting of SnPbSSe, SnPbSeTe, SnPbSTe, and a suitable mixture thereof. The group IV element may be selected from the group consisting of Si, Ge, and a suitable mixture thereof. The group IV compound may be a binary compound selected from the group consisting of SiC, SiGe, and a suitable mixture thereof.

In this case, the binary compound, the ternary compound, and the quaternary compound may be present at uniform or substantially uniform concentrations in particles, or may be partially distributed at different concentrations in the same particle. In addition, a core/shell structure in which one quantum dot surrounds (e.g., around a periphery of) another quantum dot may be represented. The interface between the core and the shell may have a concentration gradient in which an element concentration is reduced toward the center of the shell.

According to one or more embodiments of the present disclosure, the quantum dots may have the above-described core-shell structure including a core including a nanocrystal, and a shell surrounding (e.g., around a periphery of) the core. The shell of each of the quantum dots may function as a protective layer to maintain or substantially maintain a semiconductor characteristic by preventing or substantially preventing a chemical property of the core from being changed, and/or a charging layer to apply an electrophoretic property to the quantum dot. The shell may have a single layer structure or a multiple-layered structure. The interface between the core and the shell may have a concentration gradient in which an element concentration is reduced toward the center of the shell. For example, the shell of the quantum dot may include a metal or a non-metal oxide, a semiconductor compound, or a suitable combination thereof.

For example, the metal or the non-metal oxide may be a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, CoO, $Co_3O_4$, or NiO, or a ternary compound, such as $MgAl_2O_4$, $CoFe_2O_4$, $NiFe_2O_4$, or $CoMn_2O_4$, but the present disclosure is not limited thereto.

In addition, the semiconductor compound may include CdS, CdSe, CdTe, ZnS, ZnSe, ZnTe, ZnSe, ZnSe, ZnTeS, GaAs, GaP, GaSb, HgS, HgTe, InAs, InP, InGaP, Alb, or Als, but the present disclosure is not limited thereto.

The quantum dots may have a full width of half maximum (FWHM) of a light emitting wavelength spectrum of about 45 nm or less, about 40 nm or less, or about 30 nm or less. In the range, color purity or color reproducibility may be improved. In addition, because light emitted through these quantum dots is emitted in all directions, a viewing angle may be improved.

However, the form of the quantum dot is not particularly limited, and the quantum dot may have any suitable form as would be known to those having ordinary skill in the art. In more detail, the quantum dot may be used in a form of a nanoparticle, a nanotube, a nanowire, a nanofiber, or a nanoplatelet particle, which has a spherical shape, a pyramid shape, a multi-arm shape, or a cubic shape.

The quantum dot may adjust the color of light emitted, depending on a particle size. Accordingly, the quantum dot may have various light emission colors, such as blue, red, or green.

The third insulating layer 200-3 may cover the first partition BW1, the first light control pattern CCF-R, the second light control pattern CCF-G, and the third light control pattern CCF-B. For example, the third insulating layer 200-3 may be an inorganic layer that seals the first partition BW1, the first light control pattern CCF-R, the second light control pattern CCF-G, and the third light control pattern CCF-B.

Figure 4A:
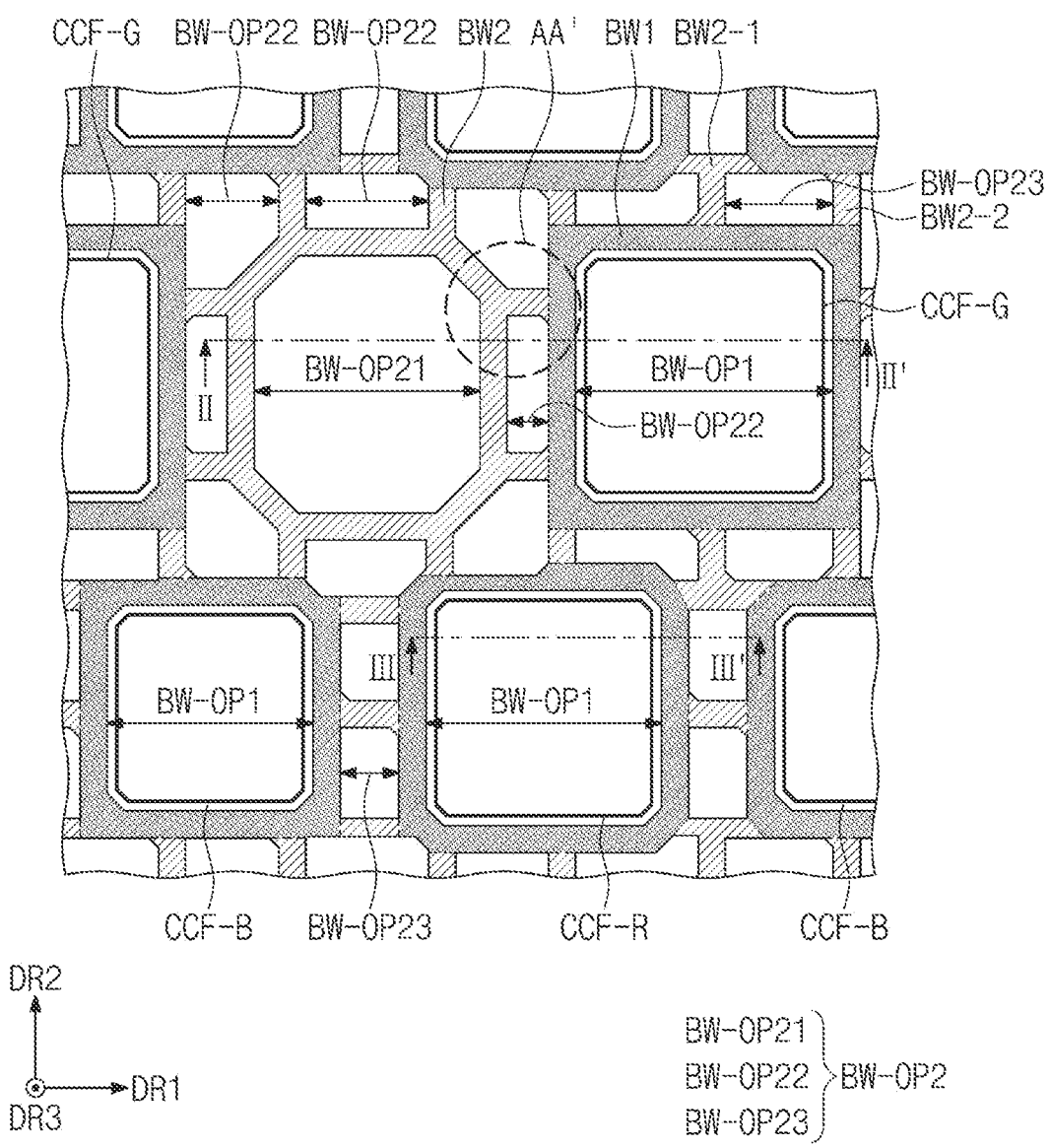
FIG. 4A is a plan view of a display panel, according to an embodiment of the present disclosure.
Figure 4B:
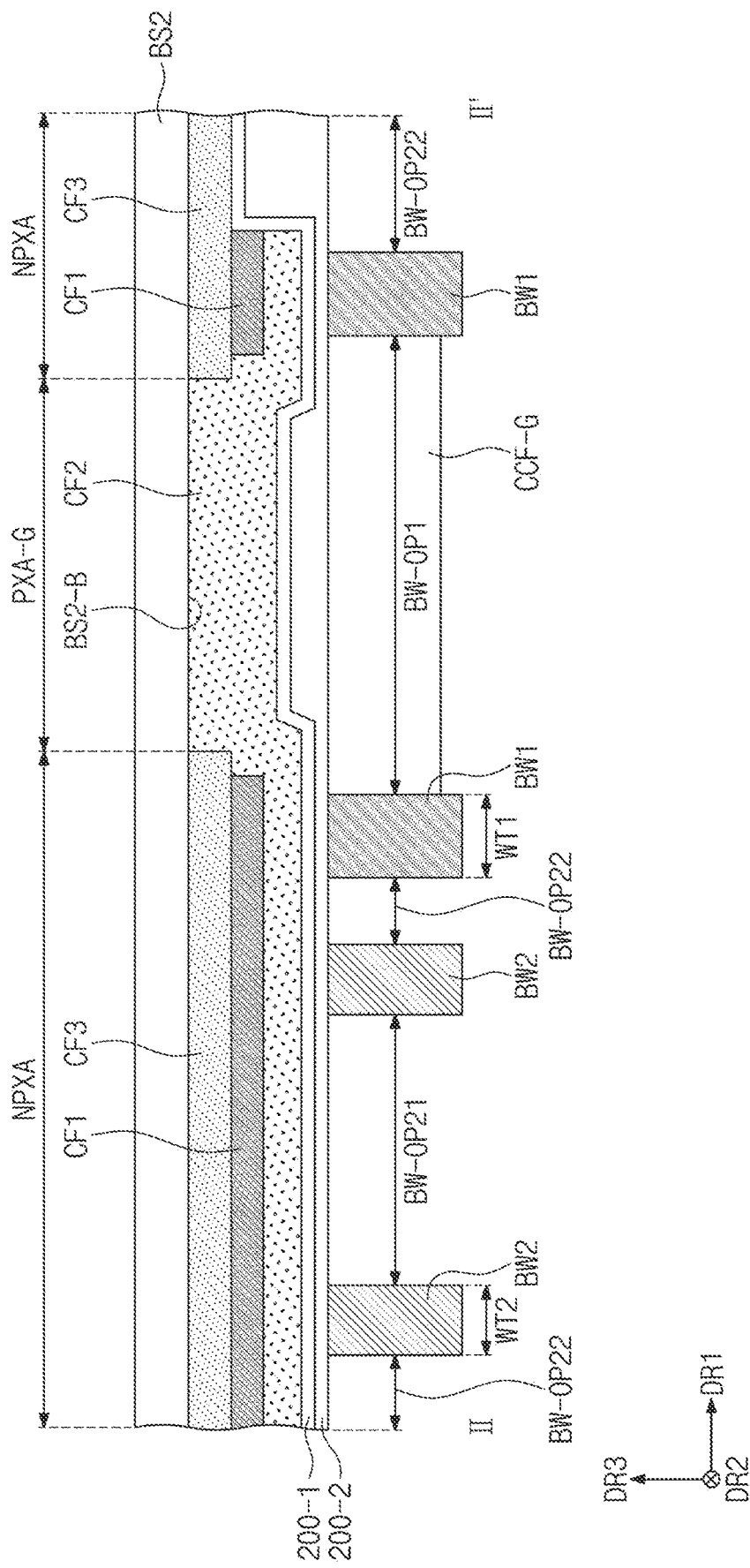
FIGS. 4B-4C are cross-sectional views of a display panel, according to an embodiment of the present disclosure.
Figure 4C:
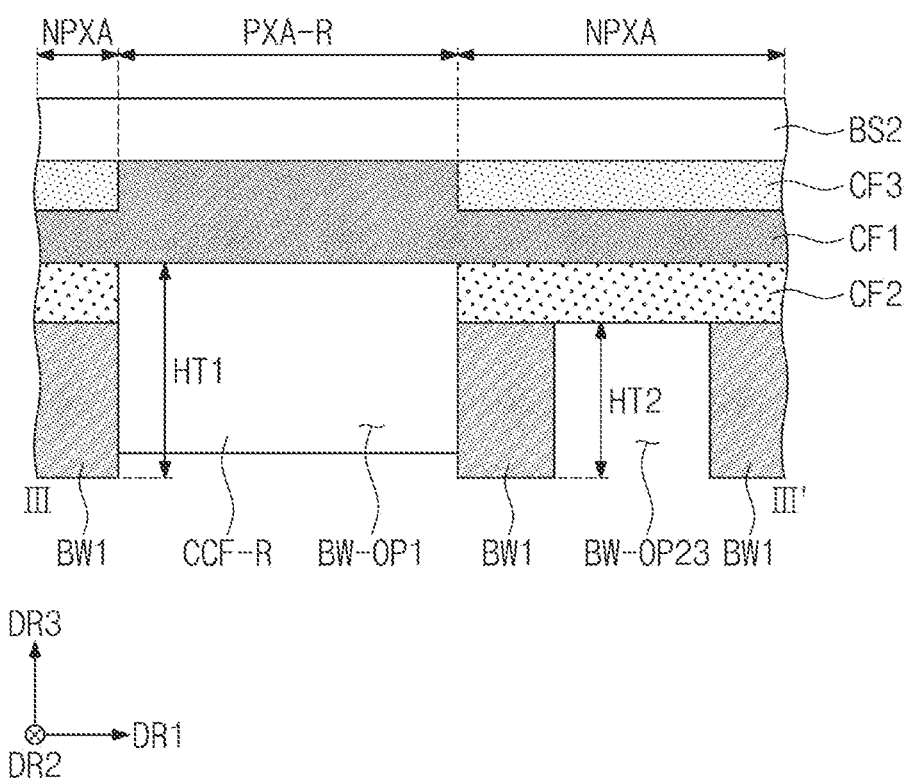

FIG. 4A is a plan view of a display panel, according to an embodiment of the present disclosure. FIG. 4B and FIG. 4C are cross-sectional views of a display panel, according to an embodiment of the present disclosure.

The embodiments described above with reference to FIG. 3A and FIG. 3B may be applied to the embodiments described herein after with reference to FIGS. 4A to 4C, and thus, redundant description thereof may not be repeated. For convenience of illustration, in FIGS. 4B and 4C, the first display substrate 100 is omitted (e.g., is not shown).

FIG. 4A is a plan view of partition layers (e.g., BW1 and BW2), according to an embodiment of the present disclosure. Referring to FIG. 4A, the partition layers may include the first partition BW1, and second partitions BW2, BW2-1, and BW2-2. The partition layers may include junction areas between the first partition BW1 and the second partitions BW2, BW2-1, and BW2-2.

The first partition BW1 may define the first opening BW-OP1. The first partition BW1 may surround (e.g., around a periphery of) the first opening BW-OP1. Each of a plurality of first partitions BW1 may define a corresponding one of the first openings BW-OP1.

The second partitions BW2, BW2-1, and BW2-2 may be disposed among the plurality of first partitions BW1. The second partition BW2 may be connected to a corresponding first partition BW1, which is adjacent to the second partition BW2, from among the plurality of first partitions BW1. In other words, the second partition BW2 may be joined to the corresponding first partition BW1 adjacent thereto.

The second partitions BW2, BW2-1, and BW2-2 may include a first type of second partition BW2, a second type of second partition BW2-1, and a third type of second partition BW2-2.

The first type of second partition BW2, the second type of second partition BW2-1, and the third type of second partition BW2-2 may have mutually different shapes from each other in a plan view. For example, the first type of second partition BW2 may be joined to sixth first partitions BW1 that are adjacent to the first type of second partition BW2. For example, the second type of second partition BW2-1 may be joined to three first partitions BW1 that are adjacent to the second type of second partition BW2-1. For example, the third type of second partition BW2-2 may be joined to two first partitions BW1 that are adjacent to the third type of second partition BW2-2. In this case, the term "joined to" may refer to the first partition BW1 being physically connected (e.g., physically coupled or attached) to the second partitions BW2, BW2-1, and BW2-2. The first partition BW1 may extend from the second partitions BW2, BW2-1, and BW2-2. The second partitions BW2, BW2-1, and BW2-2 may extend from the first partition BW1. The first partition BW1 and the second partitions BW2, BW2-1, and BW2-2 may be concurrently (e.g., simultaneously) patterned with each other, instead of being separately patterned from each other.

According to an embodiment, the second partitions BW2, BW2-1, and BW2-2 may define a second opening BW-OP2. The plurality of second partitions BW2, BW2-1, and BW2-2 may define a plurality of second openings BW-OP2. In more detail, the second partitions BW2, BW2-1, and BW2-2 may define the second openings BW-OP2 together with the first partition BW1.

The second opening BW-OP2 may include a first sub-opening BW-OP21, a second sub-opening BW-OP22, and a third sub-opening BW-OP23. The first sub-opening BW-OP21 and the second sub-opening BW-OP22 may be adjacent to each other. The second sub-opening BW-OP22 and the third sub-opening BW-OP23 may be adjacent to each other. The first sub-opening BW-OP21 may be spaced apart from the first opening BW-OP1, with the second sub-opening BW-OP22 interposed between the first sub-opening BW-OP21 and the first opening BW-OP1. The first sub-opening BW-OP21 may be defined by the first type of second partition BW2. The second sub-opening BW-OP22 and the third sub-opening BW-OP23 may be defined by the first type of second partition BW2, the second type of second partition BW2-1, and the third type of second partition BW2-2.

The first sub-opening BW-OP21, the second sub-opening BW-OP22, and the third sub-opening BW-OP23 may hereinafter be collectively referred to as second openings BW-OP21, BW-OP22, and BW-OP23.

The light control patterns CCF-R, CCF-G, and CCF-B may be disposed within (e.g., inside) the first openings BW-OP1. The first openings BW-OP1 may overlap with the light emitting areas EA1, EA2, and EA3. The second opening BW-OP2 may not overlap with the light emitting areas EA1, EA2, and EA3.

FIG. 4B illustrates a cross-sectional view taken along the line II-II' of FIG. 4A.

FIG. 4B illustrates a cross-section of the first partition BW1 and the first type of second partition BW2 (hereinafter, referred to as the second partition) that are arranged based on the second pixel area PXA-G.

The first opening BW-OP1 may be defined by the first partition BW1. The first opening BW-OP1 may overlap with the second pixel area PXA-G. The second light control pattern CCF-G may be disposed within (e.g., inside) the first opening BW-OP1. The first opening BW-OP1 overlaps with the second color filter CF2. The first partition BW1 surrounding (e.g., around a periphery of) the first opening BW-OP1 may overlap with all of the first color filter CF1, the second color filter CF2, and the third color filter CF3. Similarly, the second partition BW2 may overlap with all of the first color filter CF1, the second color filter CF2, and the third color filter CF3. The second opening BW-OP21 defined by the second partition BW2 may overlap with all of the first color filter CF1, the second color filter CF2, and the third color filter CF3.

Referring to FIG. 4B, the first insulating layer 200-1 and the second insulating layer 200-2 may be interposed between the first color filter CF1, the second color filter CF2, and the third color filter CF3, and the first partition BW1 and the second partition BW2. The first partition BW1 and the second partition BW2 may be disposed on the second insulating layer 200-2.

In FIG. 4B, a width WT1 of the first partition BW1 may be different from a width WT2 of the second partition BW2. The width WT1 of the first partition BW1 may be greater than the width WT2 of the second partition BW2. For example, the width WT1 of the first partition BW1 may be in a range of 17 μm to 19 μm. The width WT2 of the second partition BW2 may be in a range of 13 μm to 15 μm. In this case, the width WT2 of the second partition BW2 may correspond to the width WT2 of the first type of second partition BW2. According to an embodiment, a width of each of the second type of second partition BW2-1 and the third type of second partition BW2-2 may be equal to or substantially equal to the width WT1 of the first partition BW1.

FIG. 4C illustrates a cross-sectional view taken along the line III-III' of FIG. 4A. FIG. 4C illustrates the color filters CF1, CF2, and CF3, the first partition BW1, the first opening BW-OP1, and the second opening BW-OP23, based on the first pixel area PXA-R. For convenience of illustration, FIG. 4C illustrates that the first and second insulating layers 200-1 and 200-2 are omitted (e.g., are not shown) between the color filters CF1, CF2, and CF3, and the first partition BW1.

The first light control pattern CCF-R may be disposed within (e.g., inside) the first opening BW-OP1. The first color filter CF1 may be interposed between the first opening BW-OP1, in which the first light control pattern CCF-R is disposed, and the second base layer BS2. On the other hand, as described above with reference to FIG. 4B, all the first color filter CF1, the second color filter CF2, and the third color filter CF3 are interposed between the second opening BW-OP23 and the second base layer BS2.

According to an embodiment, a depth HT1 of the first opening BW-OP1 may be different from a depth HT2 of the second opening BW-OP23. The depth HT1 of the first opening BW-OP1 may be greater than the depth HT2 of the second opening BW-OP23. For example, the depth HT1 of the first opening BW-OP1 may be in a range of 9 μm to 11 μm, and the depth HT2 of the second opening BW-OP23 may be in a range of 7 μm to 9 μm. A difference between the depth HT1 of the first opening BW-OP1 and the depth HT2 of the second opening BW-OP23 may correspond to a thickness of the second color filter CF2. Here, the depth and thickness may correspond to a length in the third direction DR3.

In FIGS. 4A to 4C, the first opening BW-OP1 may overlap with the light emitting areas EA1, EA2, and EA3 and the pixel areas PXA-R, PXA-G, and PXA-B, and the second opening BW-OP2 may not overlap with the light emitting areas EA1, EA2, and EA3, and the pixel areas PXA-R and PXA-BG. The second opening BW-OP2 may overlap with the peripheral area NPXA.

The first opening BW-OP1 may overlap with one of the plurality of color filters CF1, CF2, and CF3. The second opening BW-OP2 may overlap with all color filters CF1, CF2, and CF3. The plurality of color filters CF1, CF2, and CF3, which overlap with the second opening BW-OP2, may function as a light blocking pattern that blocks light in the peripheral area NPXA.

The first opening BW-OP1 may transmit light emitted from the light emitting areas EA1, EA2, and EA3. The second opening BW-OP2 may not allow light to pass through the second opening BW-OP2. In the present specification, the term "an opening" is used in a structural context, and should not be specifically interpreted as a part that transmits light. The opening may be covered by another component (e.g., a color filter). Each of the first opening BW-OP1 and the second opening BW-OP2 may be included in the partition layer, and may be defined by the first substrate BS1 and the second substrate BS2 on the partition layer.

Figure 5:
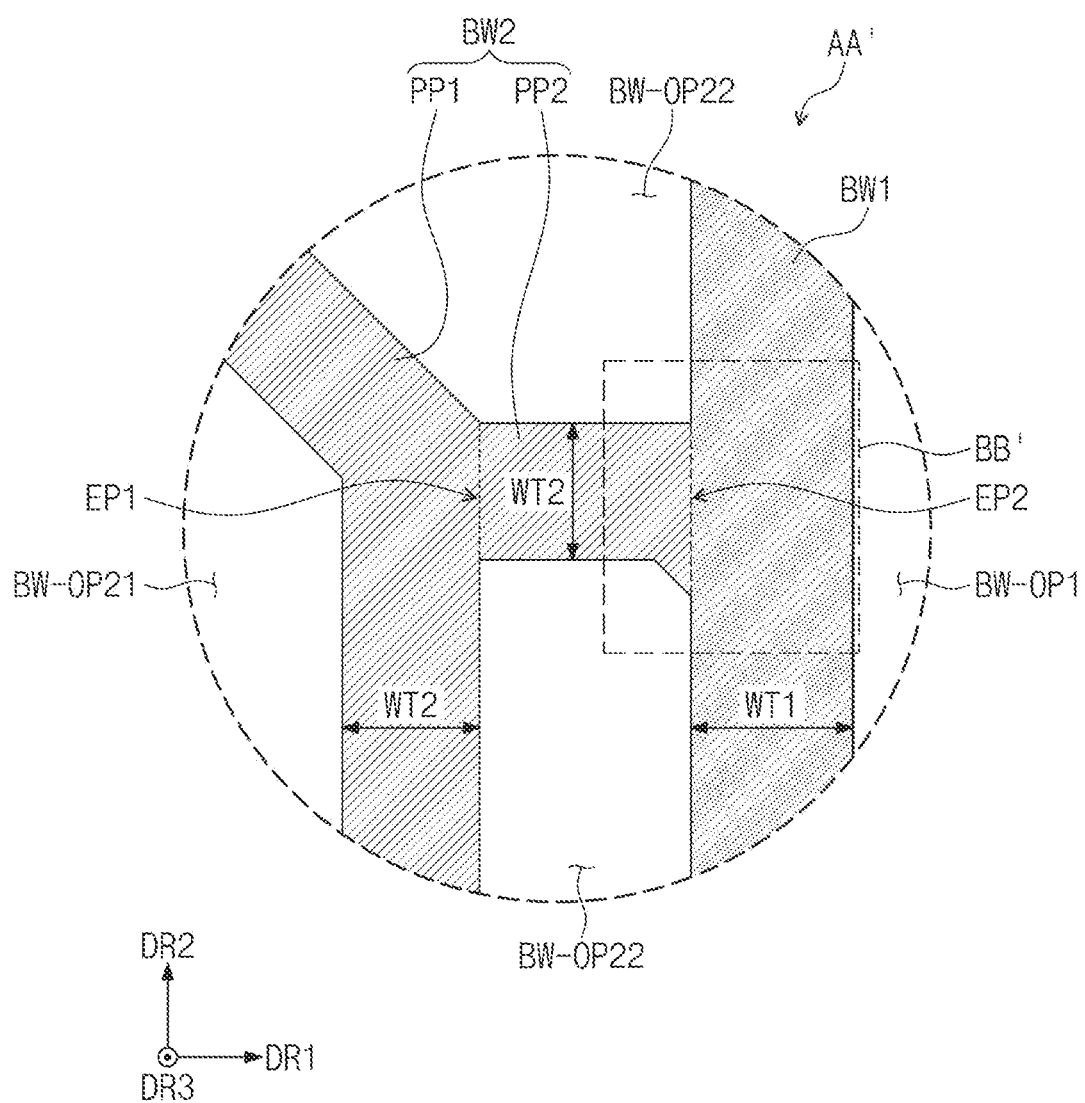
FIG. 5 is an enlarged view of the area AA' of FIG. 4A.
Figure 6:
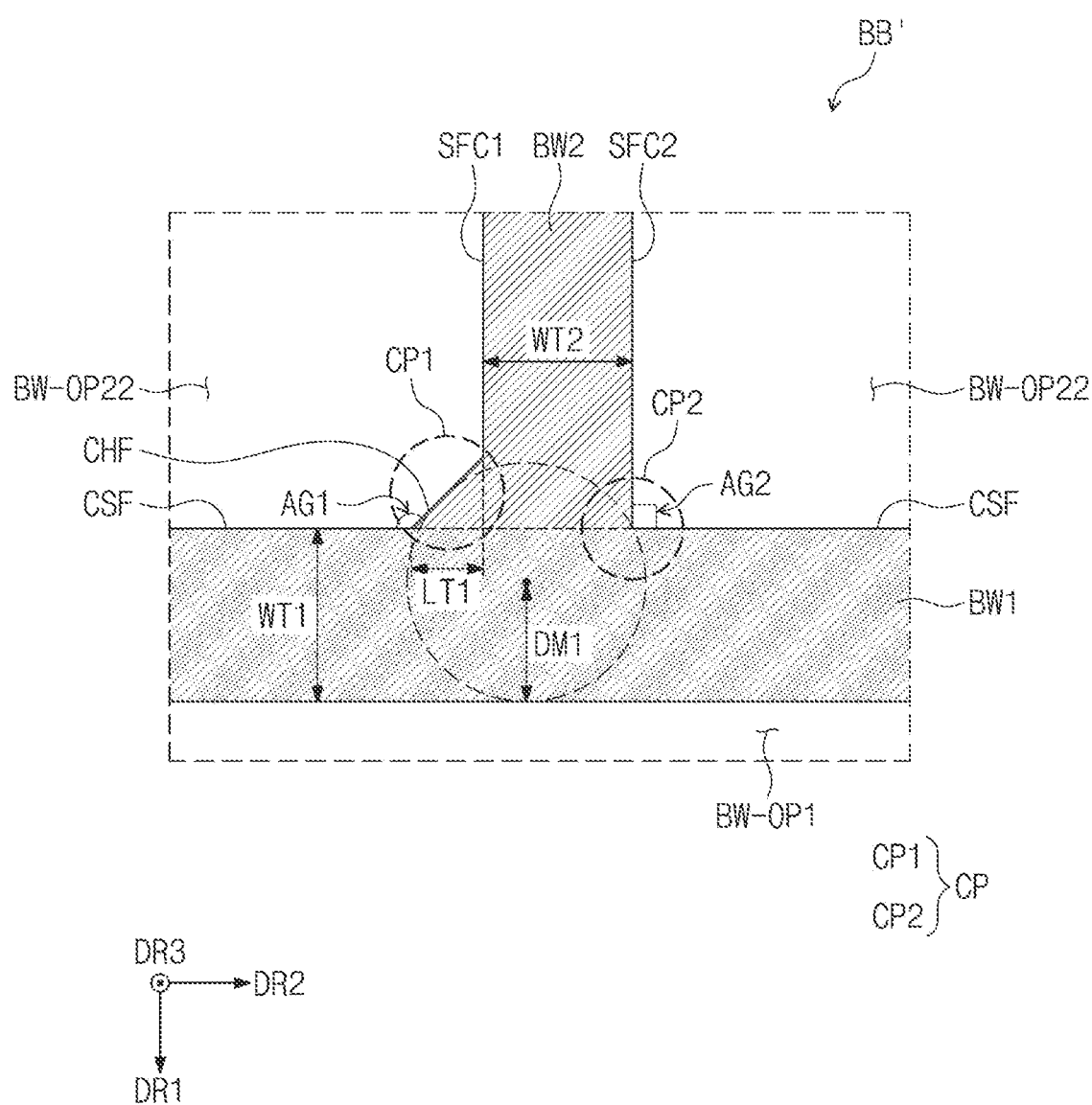
FIG. 6 is an enlarged view of the area BB' of FIG. 5.
Figure 7A:
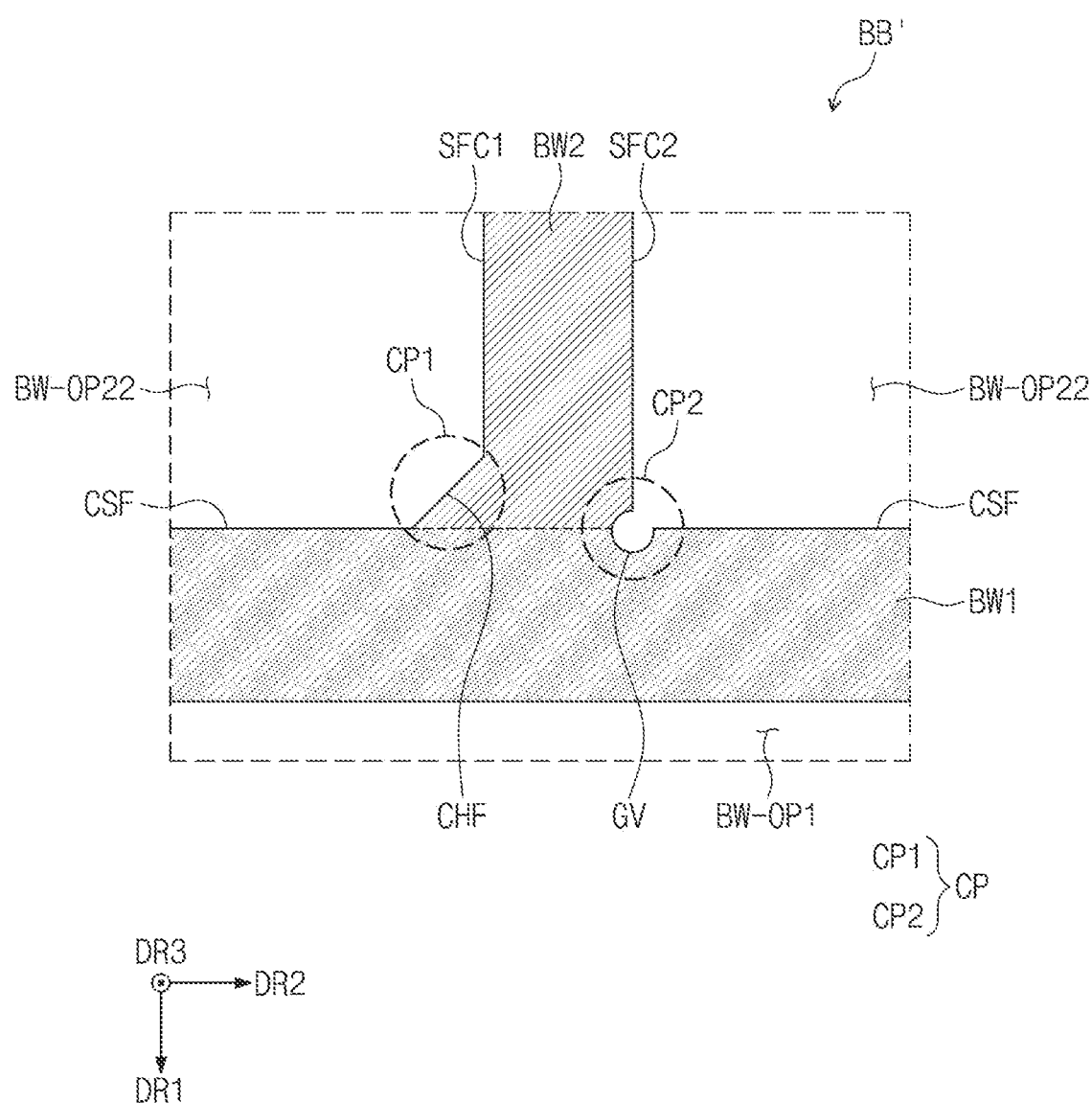
FIG. 7A is an enlarged view of the area BB' of FIG. 5.
Figure 7B:
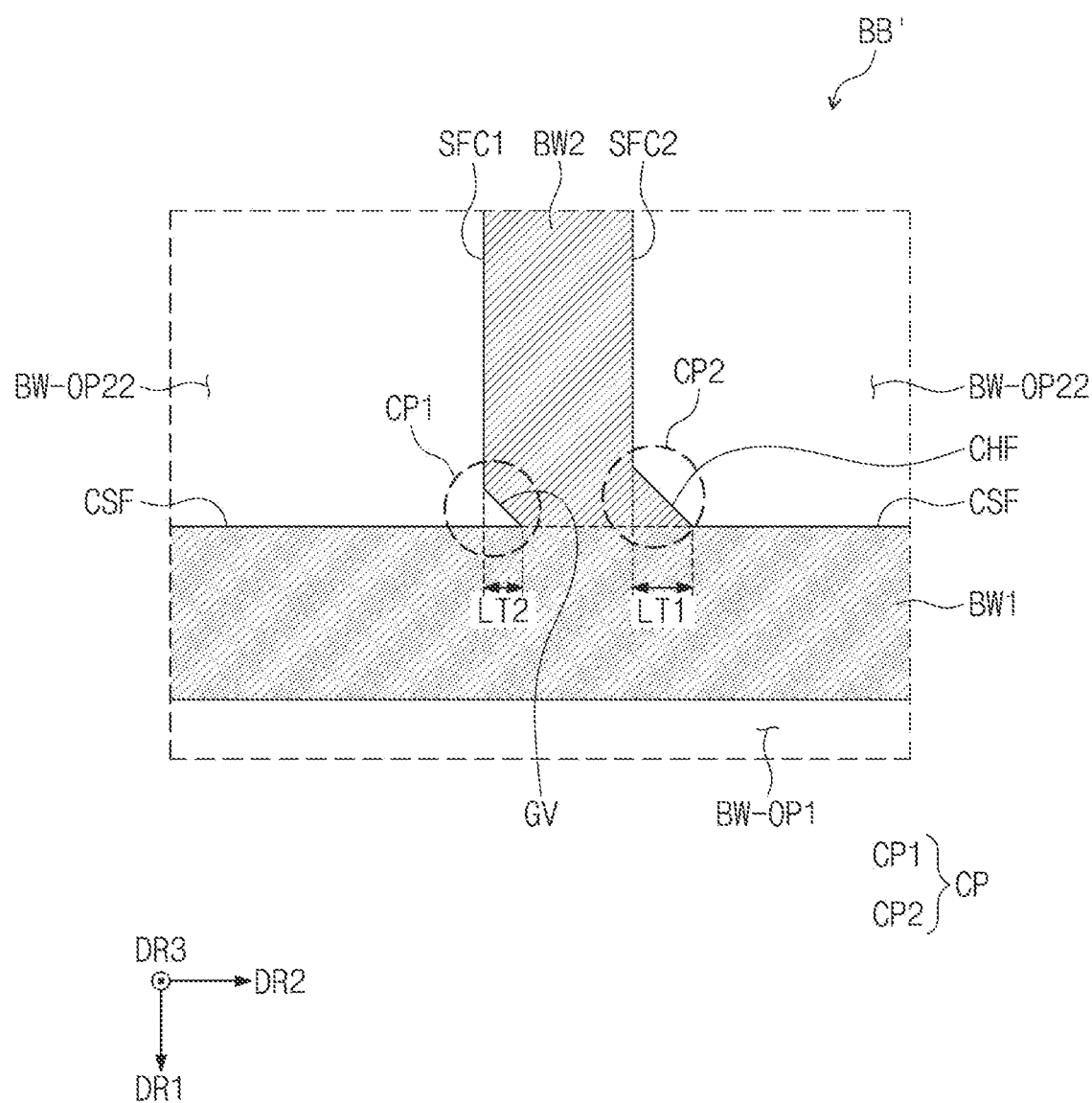
FIG. 7B is an enlarged view of the area BB' of FIG. 5.

FIG. 5 is an enlarged view of the area AA' of FIG. 4A. FIG. 6, FIG. 7A, and FIG. 7B are enlarged views of the area BB' of FIG. 5.

According to an embodiment, the second partition BW2 may include a first part PP1 and a second part PP2 as shown in FIG. 5. The first part PP1 and the second part PP2 may have an equal or substantially equal width WT2 as each other. The first part PP1 may define the first sub-opening BW-OP21. The second part PP2 may define the second sub-opening BW-OP22, together with the first partition BW1. The first part PP1 may not be in contact with the first partition BW1, and the second part PP2 may be in contact with the first partition BW1. In other words, the first part PP1 may extend from the second part PP2, and the second part PP2 may extend from the first partition BW1. The second part PP2 may be interposed between the first partition BW1 and the first part PP1. The second part PP2 may have an asymmetric shape. The second part PP2 may have the asymmetrical shape in an extending direction of the second part PP2. The extending direction of the second part PP2 may correspond to the first direction DR1.

The second part PP2 may include a first connection part EP1 and a second connection part EP2. The first connection part EP1 may correspond to a part of the second part PP2 that is in contact with the first part PP1, and the second connection part EP2 may correspond to a part of the second part PP2 that is in contact with the first partition BW1. A length of the first connection part EP1 in the second direction DR2 may be different from a length of the second connection part EP2 in the second direction DR2. The length of the second connection part EP2 in the second direction DR2 may be longer than the length of the first connection part EP1 in the second direction DR2, for example, because the second part PP2 has an asymmetrical shape in the first direction DR1. This will be described in more detail below with reference to FIGS. 6 to 7B.

FIGS. 6, 7A, and 7B illustrate the first partition BW1 and the second partition BW2 at a junction area CP. For convenience of illustration, FIGS. 6 to 7B show the junction area CP of the first type of second partition BW2. However, the junction areas CP of the second type of second partition BW2-1 and the third type of second partition BW2-2 shown in FIG. 4A may have the same or substantially the same structure as that shown in FIGS. 6, 7A, and 7B, and thus, redundant description thereof may not be repeated. In other words, the second partition BW2 shown in FIG. 6 to FIG. 7B may correspond to any one of the first type of second partition BW2, the second type of second partition BW2-1, and the third type of second partition BW2-2.

The junction area CP may refer to an area in which the first partition BW1 is joined (e.g., is connected or attached) to the second partition BW2. The junction area CP may include a first-side area CP1 and a second-side area CP2. The first-side area CP1 and the second-side area CP2 are divided based on the extending direction of the second partition BW2.

The first-side area CP1 may correspond to an area in which a first surface SFC1 of the second partition BW2 meets (e.g., contacts) a contact surface CSF of the first partition BW1. The second-side area CP2 may correspond to an area in which a second surface SFC2 of the second partition BW2 meets (e.g., contacts) the contact surface CSF of the first partition BW1.

The first-side area CP1 and the second-side area CP2 may have asymmetric shapes based on the first direction DR1, which is the extending direction of the second partition BW2. In other words, the area where the first surface SFC1 of the second partition BW2 meets (e.g., contacts) the contact surface CSF of the first partition BW1 may have an asymmetric shape or structure with respect to the area where the second surface SFC2 of the second partition BW2 meets the contact surface CSF of the first partition BW1

According to an embodiment, the first surface SFC1 of the second partition BW2 may meet (e.g., may contact) the contact surface CSF of the first partition BW1 at an obtuse angle AG1. The second surface SFC2 of the second partition BW2 may meet (e.g., may contact) the contact surface CSF of the first partition BW1 at a right angle AG2. In other words, the first surface SFC1 of the second partition BW2 and the contact surface CSF of the first partition BW1 may form the obtuse angle AG1 at the first-side area CP1, and the second surface SFC2 of the second partition BW2 and the contact surface CSF of the first partition BW1 may form the right angle AG2 at the second-side area CP2.

The second partition BW2 may include a chamfer structure (e.g., a chamfer shape) CHF in the first-side area CP1. The junction area CP may include a first contact part in the first-side area CP1, and a second contact part in the second-side area CP2. According to an embodiment, the first contact part and the second contact part may have mutually different shapes from each other. According to an embodiment, one of the first contact part of the first-side area CP1 and the second contact part of the second-side area CP2 may include a chamfer structure (e.g., a chamfer shape) CHF, and the other may not include a chamfer structure.

According to an embodiment of the present disclosure, the chamfer shape CHF is provided in any one of the first-side area CP1 and the second-side area CP2 of the junction area CP between the first partition BW1 and the second partition BW2, such that a robust structure is formed to prevent or substantially prevent the second partition BW2 and the first partition BW1 from being lost (e.g., from being disconnected or damaged).

According to an embodiment, a length LT1 corresponding to a width of the chamfer shape CHF of the first-side area CP1 in contact with the contact surface CSF may be about half of the width WT2 of the second partition BW2. For example, the length LT1 of a part of the chamfer shape CHF disposed in the first-side area CP1 that is in contact with the contact surface CSF of the first partition BW1 may be in the range of 4 μm to 8 μm. In this case, the width WT2 of the second partition BW2 may correspond to (e.g., may be) about 14 μm.

In addition, according to an embodiment of the present disclosure, a right-angle shape may be formed in the other of the first-side area CP1 and the second-side area CP2. According to one or more embodiments of the present disclosure, the second-side area CP2 having the right-angle shape is provided to prevent or substantially prevent a failure that may result from an erroneous ink droplet impact. The erroneous ink droplet impact refers to an ink droplet that erroneously impacts on an upper portion of the first partition BW1, instead of being disposed within (e.g., an inside of) the first opening BW-OP1 during the ink-jet process of forming the first light control pattern CCF-R, the second light control pattern CCF-G, and the third light control pattern CCF-B.

According to an embodiment of the present disclosure, to prevent or substantially prevent the second partition BW2 and the first partition BW1 from being lost, the chamfer shape CHF formed in the first-side area CP1 and the right-angle shape formed in the second-side area CP2 may be provided to reduce an area of the upper portion of the first partition BW1, thereby reducing a probability of the erroneous ink droplet impact. In FIG. 6, a size of a radius DM1 of an inscribed circle (e.g., a virtual circle), which is formed by the chamfer shape CHF of the first-side area CP1, the right-angle shape of the second-side area CP2, and the first partition BW1, may correspond to the area of the junction area CP when viewed in a plan view. According to an embodiment, the size of the radius DM1 of the inscribed circle may be about 12 μm. When compared with an inscribed circle of a comparative example, in which both the first-side area CP1 and the second-side area CP2 have chamfer shapes, the inscribed circle of the comparative example may have a radius of about 14 μm, and thus, the area of the junction area CP according to the present embodiment may be smaller when viewed in a plan view. Accordingly, the probability of the erroneous ink droplet impact may be reduced.

In addition, according to an embodiment of the present disclosure, when the ink erroneously impacts on the upper portion of the first partition BW1, the ink is allowed to flow into the second opening BW-OP2 along the right-angle shape of the second-side area CP2, thereby reducing or minimizing the failure that may result from the erroneous ink droplet impact.

FIGS. 7A and 7B illustrate the junction area CP according to other embodiments.

Referring to FIGS. 7A and 7B, one of the first-side area CP1 and the second-side area CP2 may have the chamfer shape CHF, and the other of the first-side area CP1 and the second-side area CP2 may include a groove GV. For example, the first-side area CP1 may have the chamfer shape CHF and the second-side area CP2 may include the groove GV, or the first-side area CP1 may include the groove GV and the second-side area CP2 may include the chamfer shape CHF. For example, as shown in FIG. 7A, the groove GV may be defined in the second contact part in which the second surface SFC2 of the second partition BW2 meets (e.g., contacts) the contact surface CSF of the first partition BW1. The groove GV may correspond to a groove that is recessed toward the first partition BW1 and/or the second partition BW2.

In FIG. 7A, the groove GV may have a circular shape. The groove GV may be recessed toward the contact surface between the first partition BW1 and the second partition BW2.

In FIG. 7B, the groove GV may be a pointed groove recessed into the second partition BW2. In another embodiment, the groove GV may be a pointed groove recessed into the first partition BW1. According to an embodiment, to prevent or substantially prevent the first partition BW1 and the second partition BW2 from being separated from each other, a length LT2 in the second direction DR2 of the groove GV defined in the first contact surface of the first-side area CP1 may be shorter than the length LT1 in the second direction DR2 of the chamfer shape CHF defined on the second contact surface of the second-side area CP2. However, the present disclosure is not limited thereto. For example, the length LT2 in the second direction DR2 of the groove GV may be equal to or greater than the length LT1 in the second direction DR2 of the chamfer shape CHF.

In FIG. 7B, the first surface SFC1 of the second partition BW2 and the contact surface CSF of the first partition BW1 may form an acute angle in the first-side area CP1. The second surface SFC2 of the second partition BW2 and the contact surface CSF of the first partition BW1 may form an obtuse angle in the second-side area CP2. In other words, the first contact surface of the first-side area CP1 may have a concave shape, and the second contact surface of the second-side area CP2 may have a convex shape.

Figure 8:
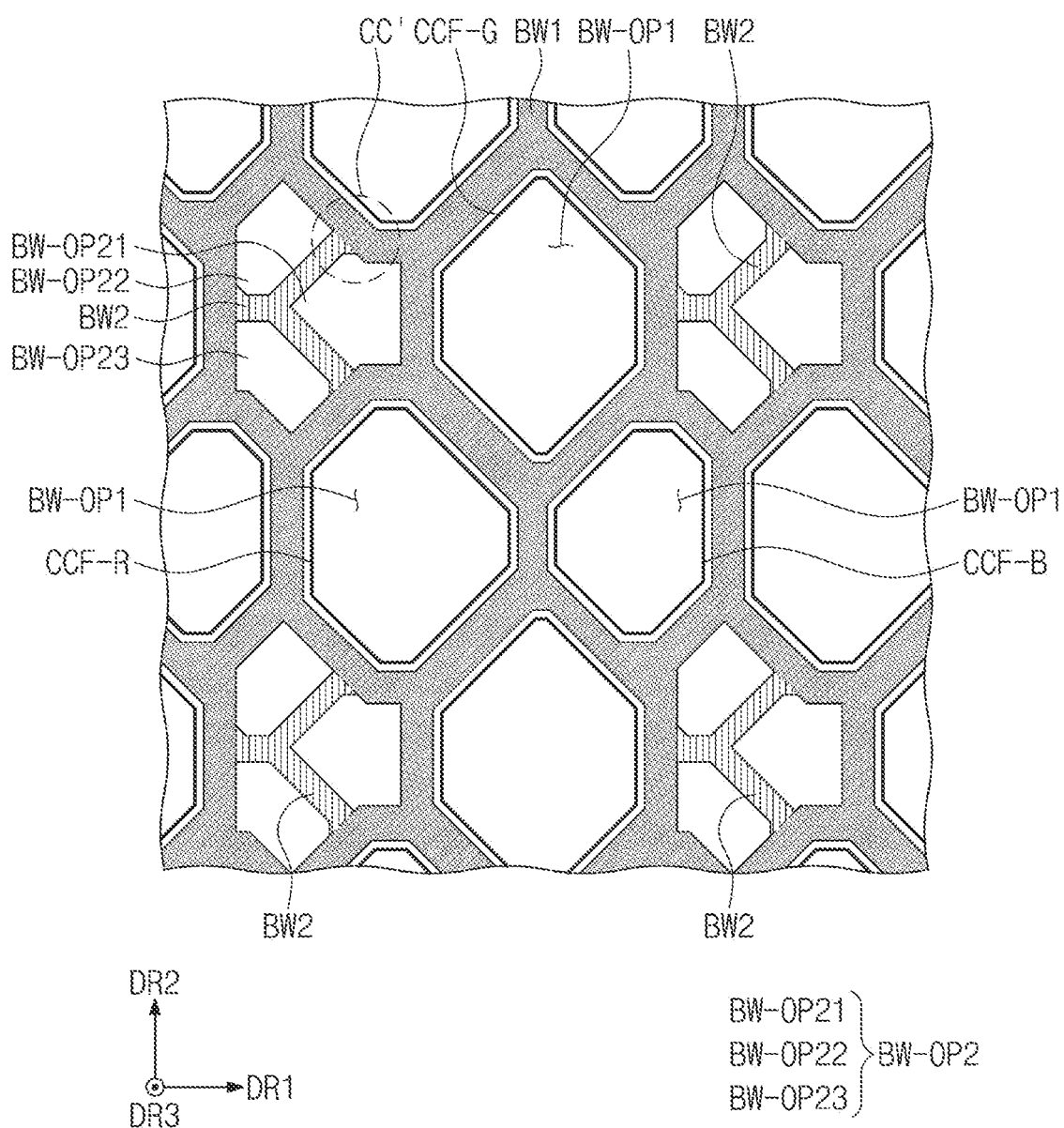
FIG. 8 is an enlarged plan view of a display area, according to an embodiment of the present disclosure.
Figure 9:
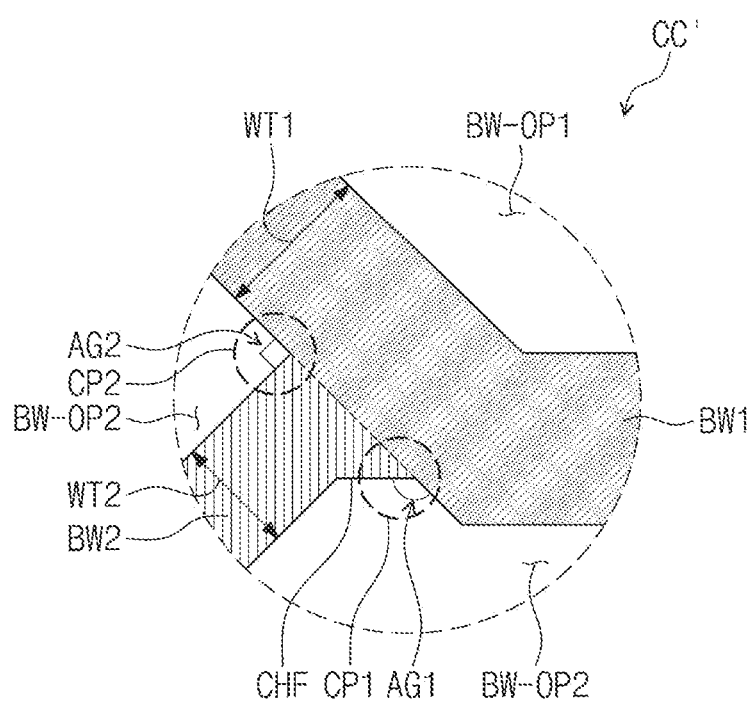
FIG. 9 is an enlarged view of the area CC' of FIG. 8.

FIG. 8 is an enlarged plan view of a display area, according to an embodiment of the present disclosure. FIG. 9 is an enlarged view of the area CC' of FIG. 8.

The embodiments shown in FIGS. 8 and 9 may be different from the embodiments described above with reference to FIG. 4A and FIG. 5. Accordingly, the differences in the embodiments of FIGS. 8 and 9 will be mainly described in more detail below, and redundant description thereof may not be repeated.

In FIGS. 8 and 9, the first partition BW1 may define a plurality of first openings BW-OP1. One first partition BW1 and a plurality of second partitions BW2 may define a plurality of second openings BW-OP2.

The plurality of first openings BW-OP1 may have different shapes and different sizes from one another. The plurality of first openings BW-OP1 may surround (e.g., around a periphery of) the second openings BW-OP2.

The second opening BW-OP2 may include a first sub-opening BW-OP21, a second sub-opening BW-OP22, and a third sub-opening BW-OP23. The first sub-opening BW-OP21, the second sub-opening BW-OP22, and the third sub-opening BW-OP23 may be spaced apart from each other, with the second partition BW2 interposed among the first sub-opening BW-OP21, the second sub-opening BW-OP22, and the third sub-opening BW-OP23.

The plurality of second partitions BW2 may be joined to the first partition BW1. According to an embodiment, the plurality of second partitions BW2 may include three junction areas CP that are formed when the plurality of second partitions BW2 are joined to the contact surfaces CSF (e.g., see FIG. 6) of the first partition BW1 that is adjacent to the plurality of second partitions BW2. Each of the junction areas CP may include a first-side area CP1 and a second-side area CP2.

Figure 10A:
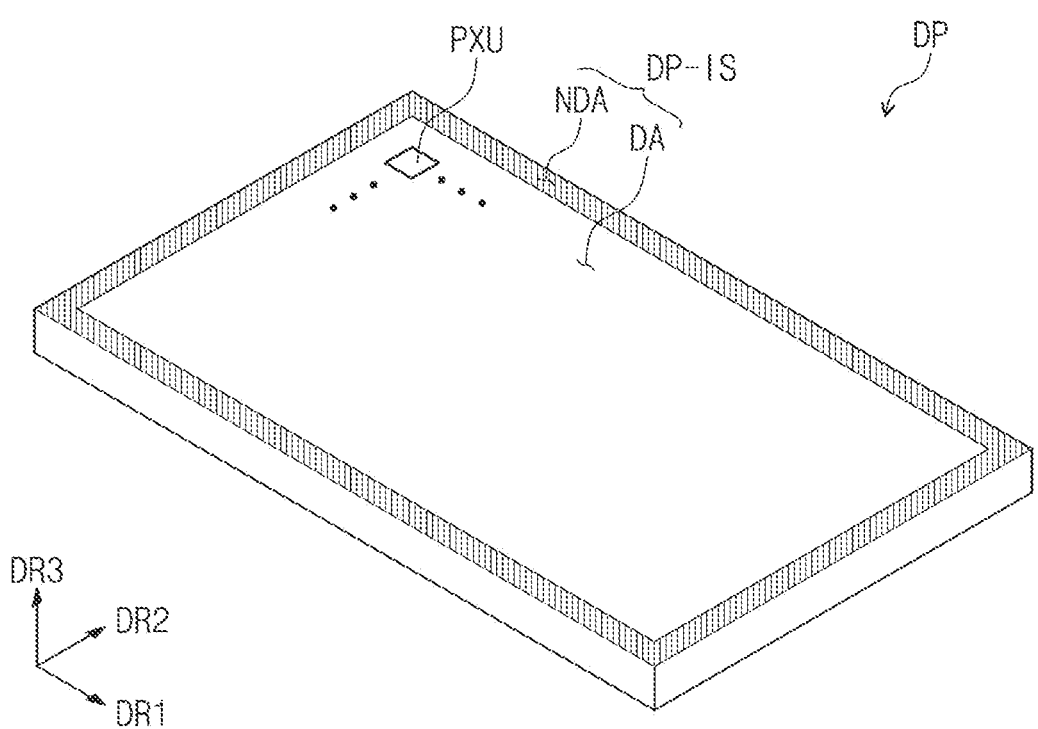
FIG. 10A is a perspective view of a display panel, according to another embodiment of the present disclosure.
Figure 10B:
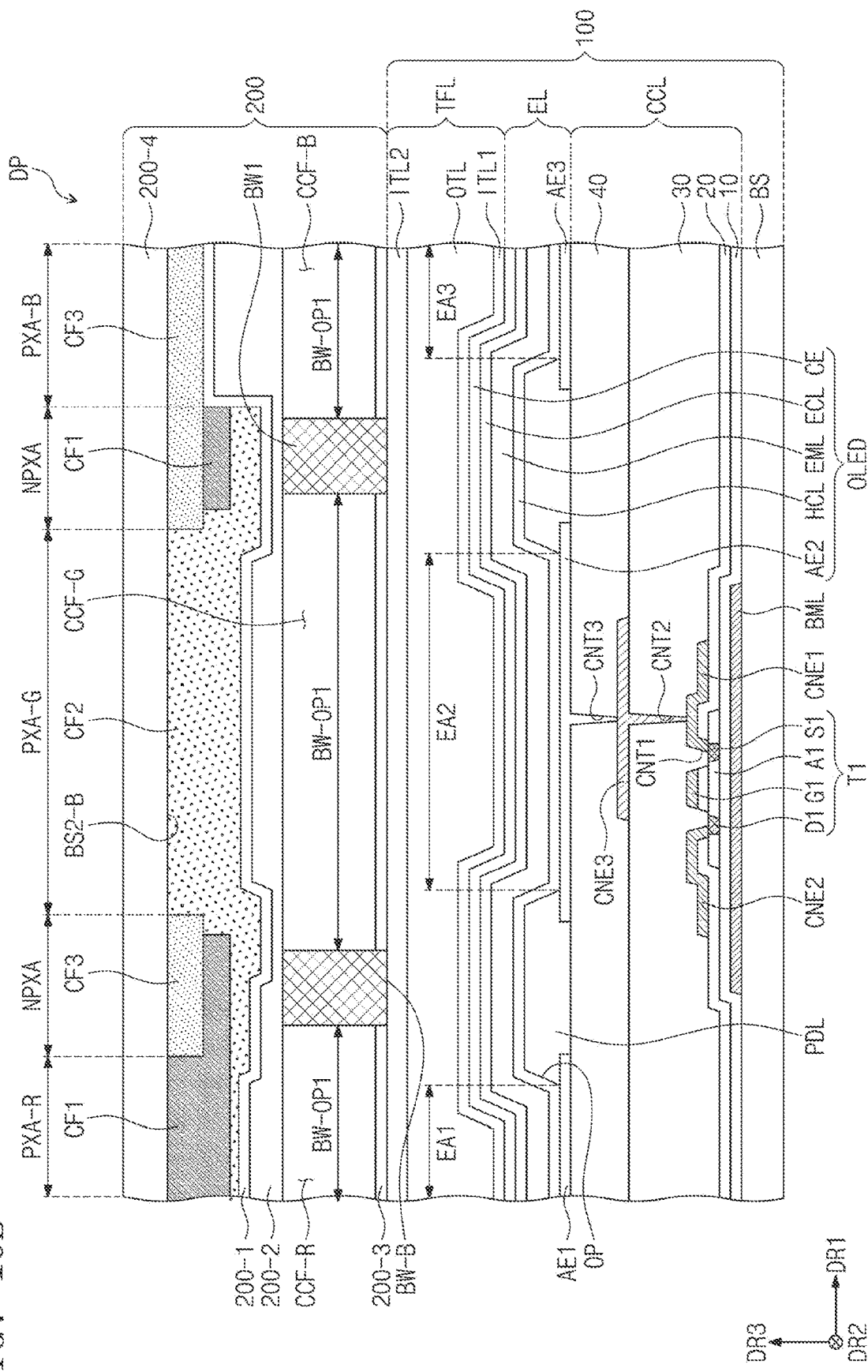
FIG. 10B is a cross-sectional view of a display panel, according to another embodiment of the present disclosure.

FIG. 10A is a perspective view of a display panel, according to another embodiment of the present disclosure. FIG. 10B is a cross-sectional view of a display panel, according to another embodiment of the present disclosure.

FIGS. 10A and 10B illustrate a display panel DP having a structure different from the structure of the display panel shown in FIG. 1A to FIG. 3B.

FIG. 10A is a perspective view of the display panel DP, according to an embodiment of the present disclosure. FIG. 10B is a cross-sectional view illustrating the display area DA shown in FIG. 10A in more detail. Hereinafter, redundant description of the same or substantially the same components in FIGS. 10A and 10B as those described above with reference to FIG. 1 to FIG. 9 may not be repeated.

According to the present embodiment, the display panel DP includes one base layer BS, which is different from the display panel DP illustrated in FIG. 1A to FIG. 9. In the manufacturing process of the display panel DP shown in FIGS. 10A and 10B, a process of connecting (e.g., coupling or attaching) the first display substrate 100 to the second display substrate 200 is skipped, and structures are sequentially formed on the base layer BS.

As illustrated in FIG. 10A and FIG. 10B, the display panel DP includes the base layer BS, a circuit layer CCL, a light emitting device layer EL, and an upper insulating layer TFL disposed on the base layer BS. The base layer BS (e.g., the first base layer BS1), the circuit layer CCL, the light emitting device layer EL, and the upper insulating layer TFL may be the same or substantially the same as those described above, and thus, redundant description thereof may not be repeated.

A light control layer 200 is disposed on the upper insulating layer TFL. The light control layer 200 corresponds to the second display substrate 200 described with reference to FIG. 1 to FIG. 9. However, the second display substrate 200 and the light control layer 200 may be different from each other according to manufacturing processes thereof. The light control layer 200 may be formed on the upper insulating layer TFL through a subsequent process, which is different from the case where the second display substrate 200 and the first display substrate 100 are formed through separate processes from one another.

The light control layer 200 includes the first partition BW1, the light control patterns CCF-R, CCF-G, CCF-B, and the color filters CF1, CF2, and CF3 disposed on the upper insulating layer TFL. When comparing the second display substrate 200 with the light control layer 200, the second display substrate 200 is significantly similar to the light control layer 200 in terms of the cross-sectional structures and the arrangement relationships, when viewed in a plan view, of the light control patterns CCF-R, CCF-G, and CCF-B, and the color filters CF1, CF2, and CF3.

The light control layer 200 may further include a plurality of insulating layers 200-1, 200-2, 200-3, and 200-4. The plurality of insulating layers 200-1, 200-2, 200-3, and 200-4 may be organic layers or inorganic layers. The third insulating layer 200-3 may be a base layer having a flat or substantially flat surface. According to an embodiment, the third insulating layer 200-3 may be omitted as needed or desired. In this case, the upper insulating layer TFL may correspond to the base layer. The first insulating layer 200-1 may be an inorganic layer, and the second insulating layer 200-2 may be an organic layer. An additional inorganic layer may be further formed between the first insulating layer 200-1 and the fourth insulating layer 200-4. According to an embodiment of the present disclosure, a protective substrate may be further disposed on the fourth insulating layer 200-4. The protective substrate may include a plastic substrate or a glass substrate.

According to one or more embodiments of the present disclosure, the display panel may include the first partition defining the first opening and the second opening, and the second partition joined to the first partition. The chamfer structure may be formed at one side of the junction area where the second partition is joined to the first partition, thereby preventing or substantially preventing the first partition and the second partition from being lost (e.g., from being disconnected or damaged).

According to one or more embodiments of the present disclosure, the right angle is formed at the opposite side of the junction area to reduce the area of the upper portion of the first partition or the second partition, thereby reducing a probability of an erroneous ink droplet impact on the upper portion of the first partition or the second partition.

According to one or more embodiments of the present disclosure, the ink droplet erroneously impacting on the upper portion of the first partition or the second partition may be allowed to flow into the second opening through the right-angle part, thereby preventing or substantially preventing the failure that may result from the erroneous ink droplet impact.

Various embodiments of the present disclosure have been described above with reference to the accompanying drawings. Although specific technology has been described as being used, the described technology is used for illustrative purposes of the embodiments of the present disclosure, without being limited to the described technology within the scope and spirit of the present disclosure as defined in the accompanying claims and their equivalents.

Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A display panel comprising:
a light emitting device layer comprising a plurality of light emitting areas to emit a first color light;
a partition layer on the light emitting device layer, and having a plurality of first openings corresponding to the plurality of light emitting areas, respectively; and
a plurality of light control patterns located within the plurality of first openings, respectively, at least one of the plurality of light control patterns being configured to convert the first color light into a second color light,
wherein the partition layer comprises:
a plurality of first partitions defining the plurality of first openings, respectively;
a plurality of second partitions connected to adjacent ones of the first partitions that are adjacent thereto in a plan view, the plurality of second partitions comprising a first type of second partition; and
a junction area corresponding to a location where the first type of second partition is joined to a first partition from among the adjacent ones of the first partitions in the plan view, and
wherein, in the plan view, the junction area comprises a first-side area, and a second-side area having an asymmetric shape with respect to the first-side area based on an extending direction in which the first type of second partition extends.

2. The display panel of claim 1, wherein the plurality of second partitions define a plurality of second openings that do not overlap with the plurality of light emitting areas, and are interposed between the plurality of first openings.

3. The display panel of claim 1, wherein the first type of second partition comprises:
a first part spaced from the first partition; and
a second part extending from the first part to contact the first partition, and
wherein the second part has an asymmetric shape.

4. The display panel of claim 3, wherein the second part comprises:
a first connection part adjacent to the first part; and
a second connection part adjacent to the first partition, and
wherein a length of the first connection part in one direction is different from a length of the second connection part in the one direction.

5. The display panel of claim 3, wherein the second part comprises:
a first surface at the first-side area; and
a second surface at the second-side area,
wherein the first surface contacts the first partition at a right angle, and
wherein the second surface contacts the first partition at an obtuse angle.

6. The display panel of claim 1, wherein the plurality of light control patterns comprise a first light control pattern, a second light control pattern, and a third light control pattern, and
wherein at least one of the first light control pattern, the second light control pattern, or the third light control pattern includes a quantum dot.

7. The display panel of claim 2, further comprising a color filter on the partition layer to transmit the second color light.

8. The display panel of claim 7, wherein the color filter comprises:
a first color filter, a second color filter, and a third color filter having mutually different colors from each other, and
wherein each of the plurality of first openings overlaps with a corresponding one of the first color filter, the second color filter, and the third color filter.

9. The display panel of claim 8, wherein each of the plurality of second openings overlaps with the first color filter, the second color filter, and the third color filter.

10. A display panel comprising:
a light emitting device layer comprising a light emitting area to emit a first color light;
a partition layer on the light emitting device layer, and having a first opening overlapping with the light emitting area, and a second opening adjacent to the first opening; and a light control pattern located in the first opening to convert the first color light to a second color light, wherein the partition layer comprises:
- a first partition defining the first opening;
- a second partition extending from the first partition in a plan view, and defining the second opening; and
- a junction area corresponding to a location where the second partition is joined to the first partition adjacent thereto in the plan view, and wherein, in the plan view, the junction area comprises a first-side area, and a second-side area having an asymmetric shape with respect to the first-side area based on an extending direction in which the second partition extends.

11. The display panel of claim 10, wherein the second opening does not overlap with the light emitting area.

12. The display panel of claim 10, wherein a width of the first partition is greater than or equal to a width of the second partition.

13. The display panel of claim 10, wherein, at the first-side area of the junction area, a first surface of the second partition forms a right angle with respect to a contact surface of the first partition, and wherein, at the second-side area of the junction area, a second surface of the second partition forms an obtuse angle with respect to the contact surface of the first partition.

14. The display panel of claim 10, wherein the junction area comprises:
- a first contact part at the first-side area, the first contact part being a part where a first surface of the second partition contacts a contact surface of the first partition; and
- a second contact part where a second surface of the second partition opposite to the first surface contacts the contact surface of the first partition, and wherein the first contact part and the second contact part have mutually different shapes from each other.

15. The display panel of claim 14, wherein the first contact part has a concave shape, and wherein the second contact part has a convex shape.

16. The display panel of claim 10, wherein the second partition comprises a first part, and a second part extending from the first part to contact the first partition, wherein the second opening comprises a first sub-opening, and a second sub-opening adjacent to the first sub-opening, and wherein the first part defines the first sub-opening, and the second part defines the second sub-opening.

17. The display panel of claim 16, wherein the first sub-opening is spaced from the first opening, with the second sub-opening interposed between the first sub-opening and the first opening.

18. A display panel comprising:
- a light emitting device layer comprising a light emitting area to emit a first color light;
- a partition layer on the light emitting device layer, and comprising a first opening overlapping with the light emitting area, and a second opening adjacent to the first opening; and
- a light control pattern located in the first opening to convert the first color light to a second color light, wherein the partition layer comprises:
- a first partition defining the first opening;
- a second partition extending from the first partition in a plan view, and defining the second opening; and
- a junction area corresponding to a location where the second partition is joined to the first partition adjacent to the second partition in the plan view, wherein, in the plan view, the junction area comprises:
- a first contact part where a first surface of the second partition contacts a contact surface of the first partition; and
- a second contact part where a second surface of the second partition opposite to the first surface contacts the contact surface of the first partition, and wherein one of the first contact part or the second contact part has a chamfer shape.

19. The display panel of claim 18, wherein the first contact part and the second contact part have mutually different shapes from each other.

20. The display panel of claim 18, wherein another of the first contact part or the second contact part includes a right-angle part.

21. The display panel of claim 18, wherein another of the first contact part or the second contact part includes a groove.

22. The display panel of claim 18, wherein another of the first contact part or the second contact part includes an acute-angle part.

* * * * *